US010842038B2

(12) United States Patent
Ross et al.

(10) Patent No.: US 10,842,038 B2
(45) Date of Patent: Nov. 17, 2020

(54) IN-PLACE RETROFIT OF PLC CONTROL SYSTEMS

(71) Applicant: FISHER-ROSEMOUNT SYSTEMS, INC., Round Rock, TX (US)

(72) Inventors: William Scott Ross, Cedar Park, TX (US); James Aaron Crews, Cedar Park, TX (US)

(73) Assignee: FISHER-ROSEMOUNT SYSTEMS, INC., Round Rock, TX (US)

(*) Notice: Subject to any disclaimer, the term of this patent is extended or adjusted under 35 U.S.C. 154(b) by 0 days.

(21) Appl. No.: 16/575,489

(22) Filed: Sep. 19, 2019

(65) Prior Publication Data
US 2020/0015381 A1 Jan. 9, 2020

Related U.S. Application Data

(62) Division of application No. 15/722,615, filed on Oct. 2, 2017, now Pat. No. 10,426,055.

(51) Int. Cl.
*G05B 19/05* (2006.01)
*H05K 7/14* (2006.01)

(52) U.S. Cl.
CPC .......... *H05K 7/1468* (2013.01); *G05B 19/05* (2013.01); *H05K 7/1467* (2013.01); *H05K 7/1479* (2013.01); *G05B 2219/1134* (2013.01)

(58) Field of Classification Search
CPC .... G05B 19/05; G05B 19/042; G05B 19/418; G05B 19/4188; G05B 2219/1134;
(Continued)

(56) References Cited

U.S. PATENT DOCUMENTS 5,997,313 A 12/1999 Jones et al.
7,058,693 B1* 6/2006 Baker, Jr. .............. H04L 67/025
700/17
(Continued)

FOREIGN PATENT DOCUMENTS

EP 1 995 652 A1 11/2008

OTHER PUBLICATIONS

1756-UM001F-EN-P, ControlLogix Controllers User Manual_pp. 1-138_May 2005.*
(Continued)

*Primary Examiner* — Timothy J Thompson
*Assistant Examiner* — Guillermo J Egoavil
(74) *Attorney, Agent, or Firm* — Marshall, Gerstein & Borun LLP

(57) ABSTRACT

A method for upgrading a portion of a process control system from a legacy programmable logic controller (PLC) to a non-PLC process controller is disclosed. A mounting rack sized to fit into a space occupied by legacy hardware is assembled and populated with replacement hardware that includes an I/O card, an I/O terminal block, and a custom interface module. The custom interface module is coupled to the I/O card via the I/O terminal block and to a plurality of process control field devices via a legacy wiring mechanism coupled to legacy wiring of the process control system, without requiring modification or re-termination of the legacy wiring. The legacy wiring mechanism is disconnected from the legacy hardware, the rack containing the legacy hardware is removed and replaced with the mounting rack, and the legacy wiring mechanism is coupled to the custom interface module.

17 Claims, 14 Drawing Sheets

(58) Field of Classification Search
CPC .. G05B 2219/25232; G05B 2219/2609; H05K 7/14; H05K 7/1467; H05K 7/1468; H05K 7/1479
USPC ...................................... 361/679.4; 174/17 R
See application file for complete search history.

(56) References Cited

U.S. PATENT DOCUMENTS

| | | | | |
|---|---|---|---|---|
| 9,383,739 | B2* | 7/2016 | Schauer | G06F 13/105 |
| 2006/0015195 | A1* | 1/2006 | Lehman | G05B 19/0428 |
| | | | | 700/83 |
| 2007/0067458 | A1* | 3/2007 | Chand | G06F 16/258 |
| | | | | 709/226 |
| 2010/0131084 | A1* | 5/2010 | Van Camp | G06F 8/65 |
| | | | | 700/86 |
| 2011/0200392 | A1* | 8/2011 | Moncrief, III | B09C 1/002 |
| | | | | 405/128.5 |
| 2015/0036292 | A1* | 2/2015 | Rai | H05K 1/0204 |
| | | | | 361/692 |
| 2016/0174406 | A1 | 6/2016 | Dobler et al. | |

OTHER PUBLICATIONS

1756-UM058C-EN-P, ControlLogix Digital I_O Modules User Manual_pp. 1-250_Mar. 2001.*
Migrat-pp003_-en-e_Allen-Bradley_pp. 1-6_Jan. 2016.*
1756-UM058C-EN-P, ControlLogix Digital I_O Modules User Manual_pp. 1-250_Mar. 2001_b.*
ControlLogix Controllers User Manual_pp. 1-138_May 2005_c.*
Migrat-pp003_-en-e Allen-Bradley_pp. 1-6_Jan. 2016_a1.*
PLC-5-and-1771-IO-Migration-to-ControlLogix_pp. 1-27_2015.*
1756-Controllogix Discrete IO Modules Users ManuaM—250 pages_Mar. 2001_b; google search—Control Logix Digital IO Modules User Manual_b.
ControlLogix Controllers User ManuaM—138 pages_May 2005_c; google search—ControlLogix Controllers User Manual_c.
Migrat-pp003_-en-e_Allen-Bradley_1-6 pages_Jan. 2016—_a1; google search—Migration from PLC legacy to Non-PLC pdf.
PLC-5-and-1771-IO-Migration-to-ControlLogix_1-27 pages_2015; google search—mounting rack for PLC-5 controller and 1771 IO to Control Logix system.
Search Report for Application No. GB1815283.5, dated Mar. 15, 2019.

* cited by examiner

IN-PLACE RETROFIT OF PLC CONTROL SYSTEMS

This application is a divisional of U.S. patent application Ser. No. 15/722,615, filed Oct. 2, 2017, entitled "In-Place Retrofit of PLC Control Systems," the entire disclosure of which is hereby expressly incorporated by reference herein.

FIELD OF THE DISCLOSURE

The present disclosure generally relates to input/output (I/O) wiring in process control plants and, more particularly, to methods, systems, and apparatus for retrofitting a legacy programmable logic controller (PLC) based system to one that uses a distributed process controller, without requiring re-termination of field device wiring.

BACKGROUND

Distributed process control systems, like those used in chemical, petroleum or other process plants, typically include one or more process controllers communicatively coupled to one or more field devices via analog, digital or combined analog/digital buses, or via a wireless communication link or network. The field devices, which may be, for example, valves, valve positioners, switches and transmitters (e.g., temperature, pressure, level and flow rate sensors), are located within the process environment and generally perform physical or process control functions such as opening or closing valves, measuring process parameters, etc. to control one or more processes executing within the process plant or system. Smart field devices, such as the field devices conforming to the well-known Fieldbus protocol may also perform control calculations, alarming functions, and other control functions commonly implemented within the controller. The process controllers, which are also typically located within the plant environment, receive signals indicative of process measurements made by the field devices and/or other information pertaining to the field devices and execute a controller application that runs, for example, different control modules which make process control decisions, generate control signals based on the received information and coordinate with the control modules or blocks being performed in the field devices, such as HART®, Wireless HART®, and FOUNDATION® Fieldbus field devices. The control modules in the controller send the control signals over the communication lines or links to the field devices to thereby control the operation of at least a portion of the process plant or system.

Information from the field devices and the controller is usually made available over a communications backbone to one or more other hardware devices, such as operator workstations, personal computers or computing devices, data historians, report generators, centralized databases, or other centralized administrative computing devices that are typically placed in control rooms or other locations away from the harsher plant environment. Each of these hardware devices typically is centralized across the process plant or across a portion of the process plant. These hardware devices run applications that may, for example, enable an operator to perform functions with respect to controlling a process and/or operating the process plant, such as changing settings of the process control routine, modifying the operation of the control modules within the controllers or the field devices, viewing the current state of the process, viewing alarms generated by field devices and controllers, simulating the operation of the process for the purpose of training personnel or testing the process control software, keeping and updating a configuration database, etc. The communications backbone utilized by the hardware devices, controllers and field devices may include a wired communication path, a wireless communication path, or a combination of wired and wireless communication paths.

As an example, the DeltaV™ control system, sold by Fisher-Rosemount Systems, Inc., includes multiple applications stored within and executed by different devices located at diverse places within a process plant. A configuration application, which resides in one or more workstations or computing devices, enables users to create or change process control modules and download these process control modules via a communications backbone to dedicated distributed controllers. Typically, these control modules are made up of communicatively interconnected function blocks, which are objects in an object oriented programming protocol that perform functions within the control scheme based on inputs thereto and that provide outputs to other function blocks within the control scheme. The configuration application may also allow a process engineer to create or change operator interfaces which are used by a viewing application to display data to an operator and to enable the operator to change settings, such as set points, within the process control routines. Each dedicated controller and, in some cases, one or more field devices, stores and executes a respective controller application that runs the control modules assigned and downloaded thereto to implement actual process control functionality. The viewing applications, which may be executed on one or more operator workstations (or on one or more remote computing devices in communicative connection with the operator workstations and the communications backbone), receive data from the controller application via the communications backbone and display this data to process control system designers, operators, or users using the user interfaces, and may provide any of a number of different views, such as an operator's view, an engineer's view, a technician's view, etc. A data historian application is typically stored in and executed by a data historian device that collects and stores some or all of the data provided across the communications backbone while a configuration database application may run in a still further computer attached to the communications backbone to store the current process control routine configuration and data associated therewith. Alternatively, the configuration database may be located in the same workstation as the configuration application.

In many processes, legacy Programmable Logic Controllers (PLCs) are integrated into the process. For instance, older portions of a process plant may originally have implemented PLCs to control those portions of the process plant. As the process plant may have expanded or modernized, portions of the process plant may have implemented non-PLC distributed control solutions (e.g., the aforementioned DeltaV™ control system), while leaving in place the legacy PLC solutions that were already implemented and choosing to integrate the legacy PLCs into the new systems. For a variety of reasons, integrating the legacy PLCs into the new systems—usually with significant investments of time and effort—remained a preferable solution.

One impediment to retrofitting legacy PLC-based plant configurations is legacy wiring. Facilitating communication between the field devices in the process plant and the devices—such as PLCs and controllers—that implement control strategies to operate those field devices, typically involves running wiring from the field devices to a marshaling cabinet or other centralized area at which the wires are organized and terminated. Typically, input signals from the field devices to the control system are brought together into groups, while output signals from the control system to the field devices are grouped together. The groups of wires (and the signals they carry) may be further grouped by the types of signals carried by the wiring (e.g., by voltage, according to whether the signals are discrete or analog, etc.), and terminated at or near a set of I/O interface devices. The I/O interface devices facilitate communication of the signals to the control device.

In some systems, for example, each group of wires may be terminated at an associated swing-arm or I/O card field termination connector that couples the signal carried on the wires to a corresponding I/O card by means of a connector—such as a card-edge connector, a contact connector, etc.—that typically has a higher signal density than the wiring itself. The use of the swing-arm allows the wiring to be disconnected from the I/O card for maintenance or troubleshooting purposes. That is, by removing the swing-arm from the I/O card, the I/O card can be removed and replaced if it fails, without having to individually detach (and later re-terminate) each of the numerous wires that the swing-arm carries.

While the use of swing-arms facilitates movement of the wiring bundle, that movement is limited by a variety of factors. For example, as can be appreciated, large bundles of wiring can be difficult to manipulate due to the relatively large amounts of copper contained therein. Adding to this difficulty is the fact that legacy wiring, in particular, may have become less flexible over time, or may have insulation that has become brittle, putting the wiring at risk for short circuits.

Another impediment to retrofitting legacy PLC-based plant configurations is consideration of available space. Typically, process plants (or portions thereof) do not leave significant room for later expansion and, as a result, it can be difficult to perform a retrofit without physical modification of the process plant (or portion thereof), extended disruption of the process (and associated revenue), and the like. The newer control systems typically require space that is not available in the rack rooms that house the legacy PLC-based solutions, and sending the signals from the rack rooms housing the terminated signals to the controllers in other available space can require many long lengths of cable running through small spaces, which can result in signal cross-talk, the result of which is unreliability of the process as a whole.

SUMMARY

In embodiments, a method for upgrading a process control system from a legacy programmable logic controller (PLC) to a non-PLC process controller includes assembling a mounting rack. The mounting rack is sized and configured to fit into a space occupied by a rack containing legacy hardware associated with the legacy PLC. The method also includes populating the mounting rack replacement hardware. The replacement hardware includes the non-PLC process controller or a carrier extender configured to be communicatively coupled to the non-PLC process controller, an input/output (I/O) card communicatively coupled to the non-PLC process controller or the carrier extender in the mounting rack, an I/O terminal block communicatively coupled to the I/O card and configured to communicate to the I/O card signals corresponding to a plurality of process control field devices and/or to communicate from the I/O card signals to a plurality of process control field devices, and a custom interface module communicatively coupled to (i) the I/O card via the I/O terminal block and (ii) the plurality of process control field devices via a legacy wiring mechanism coupled to legacy wiring of the process control system, without requiring modification or re-termination of the legacy wiring. The method also includes disconnecting the legacy wiring mechanism from the legacy hardware associated with the PLC, removing the rack containing the legacy hardware associated with the legacy PLC, placing the assembled mounting rack, including the replacement hardware, into a space previously occupied by the rack containing the legacy hardware associated with the legacy PLC, and coupling the legacy wiring mechanism to the custom interface module.

In other embodiments, a custom interface module includes a legacy wiring coupling mechanism configured to mechanically and electrically couple the custom interface module to a counterpart legacy wiring coupling mechanism. The counterpart legacy wiring coupling mechanism has terminated to it legacy wiring for carrying a plurality of signals to or from a plurality of process control field devices. The custom interface module also includes an I/O coupling mechanism configured to facilitate electrical coupling of the custom interface module to an I/O card such that for each of the plurality of signals, a corresponding signal is communicated to or from the I/O card via the I/O coupling mechanism. Further, the custom interface module includes a conditioning module electrically disposed between the I/O coupling mechanism and the legacy wiring coupling mechanism, wherein the conditioning module is configured to, for each of the plurality of signals (i) convert a signal received at the legacy wiring coupling mechanism into a signal that can be transmitted to the I/O card via the I/O coupling mechanism, or (ii) to convert a signal received from the I/O card via the I/O coupling mechanism into a signal that can be transmitted to a corresponding process control field device via the legacy wiring coupling mechanism.

In still other embodiments, a system for upgrading a process control system from a legacy programmable logic controller (PLC) to a non-PLC process controller includes a mounting rack sized and configured to fit into a space occupied by legacy hardware associated with the legacy PLC, a non-PLC process controller, and an input/output (I/O) card coupled to the non-PLC process controller and mounted in the mounting rack. The system also includes an I/O terminal block communicatively coupled to the I/O card and configured to pass to the I/O card signals corresponding to a plurality of process control field devices and/or to send from the I/O card signals to a plurality of process control field devices. The I/O terminal block is mounted in the mounting rack. Further, the system includes a custom interface module mounted in the mounting rack and communicatively coupled to (i) the I/O card via the I/O terminal block and (ii) the plurality of process control field devices via a legacy wiring mechanism coupled to legacy wiring of the process control system, without requiring modification or re-termination of the legacy wiring.

BRIEF DESCRIPTION OF THE DRAWINGS

The features and advantages of the methods, apparatus, and systems described herein will be best appreciated upon reference to the following detailed description and the accompanying drawings, in which.

DETAILED DESCRIPTION

Generally speaking, a control system of this disclosure includes a variety of process control devices communicatively coupled to a distributed control system and one or more process control devices coupled to a legacy programmable logic controller (PLC) that may itself be integrated into the distributed control system or, alternatively, may be a stand-alone portion of the process plant. That is, the PLC and the process control devices coupled to it can operate as a standalone PLC, a controller of a skid-mounted system, or as a module in modular plant construction. The control system as a whole can be built natively on a platform such as DeltaV, which supports distributed control, so that the configuration, security mechanisms, and the communications of the devices therein, including, in embodiments, the legacy PLC, are fully compatible with the DCS into which the legacy PLC is integrated. In the present disclosure, the legacy PLC is replaced with hardware—including controllers and input/output (I/O) devices—native to the DCS without requiring the relocation and/or re-termination of legacy wiring that previously coupled the one or more process control devices to the legacy PLC. The process of replacing the legacy PLC and associated hardware with the native DCS hardware is referred to herein as "retrofitting."

To facilitate retrofitting, a DCS controller and associated I/O hardware are mounted in a custom rack sized to fit within a space occupied by legacy PLC hardware. The I/O hardware in the custom rack, and the custom rack itself, are configured such that custom interface modules include connecting hardware positioned to couple to complementary connecting hardware on swing-arms or other field device wiring termination hardware coupled to legacy wiring to the field devices, as will be described herein. Each of the custom interface modules is selected according to the legacy I/O hardware that it is replacing, such that the custom interface module for legacy wiring on which input signals are present is an input-type custom interface module, the custom interface module for legacy wiring on which output signals are present is an output-type custom interface module, etc.

Further, each of the custom interface modules may include signal conditioning circuitry to convert the signals on the legacy wiring to which it will be connected into signals that may be coupled directly to the DCS via the associated I/O hardware.

A method of retrofitting the control system, as described in this disclosure, requires only disconnecting the legacy wiring from the legacy I/O hardware, replacing the legacy I/O hardware with the custom rack, and connecting the legacy wiring to the custom interfaces cards to communicatively couple the field devices to the DCS controller via the new I/O hardware.

Figure 3:
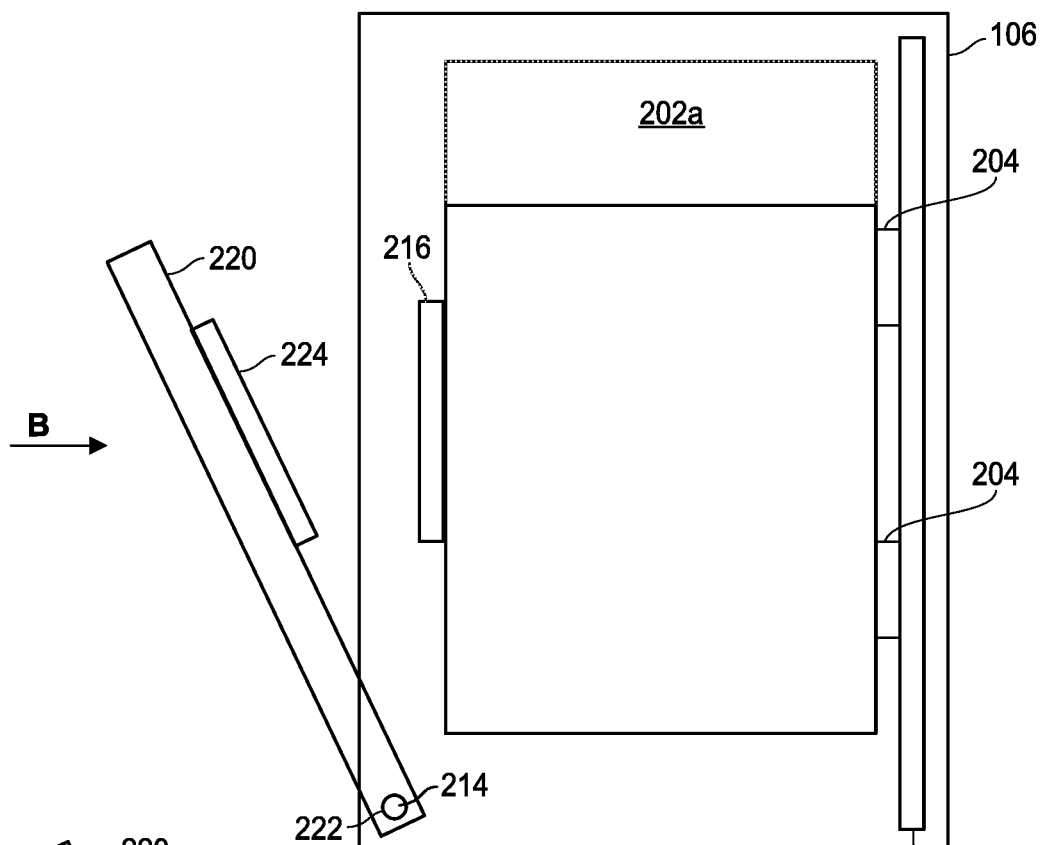
FIG. 3 illustrates a side view of the example I/O chassis of FIG. 2A.
Figure 4:
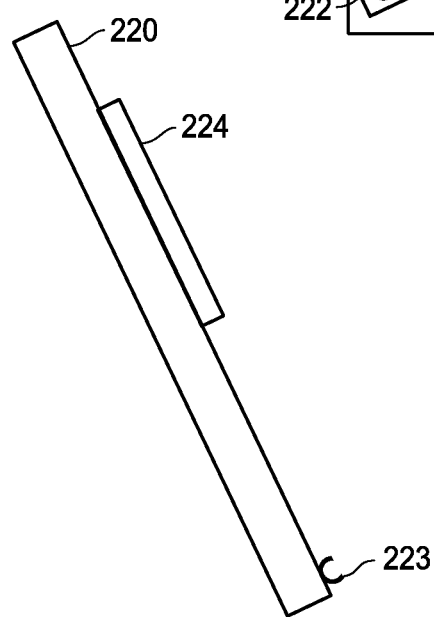
FIG. 4 illustrates an alternate embodiment of a swing-arm.

Next, an example distributed process control system, including, in addition to a portion of the control system commissioned natively in the DCS, a portion of the control system operating according to a legacy PLC and a portion of the control system that is retrofitted from a legacy PLC, is discussed with reference to FIG. 1. Examples of the hardware associated with the portion of the control system operating according to the legacy PLC are depicted in FIGS. 2, 3, and 4. Examples of the hardware associated with the portion of the control system that is retrofitted from a legacy PLC are discussed with reference to FIGS. 4 and 5.

Figure 1:
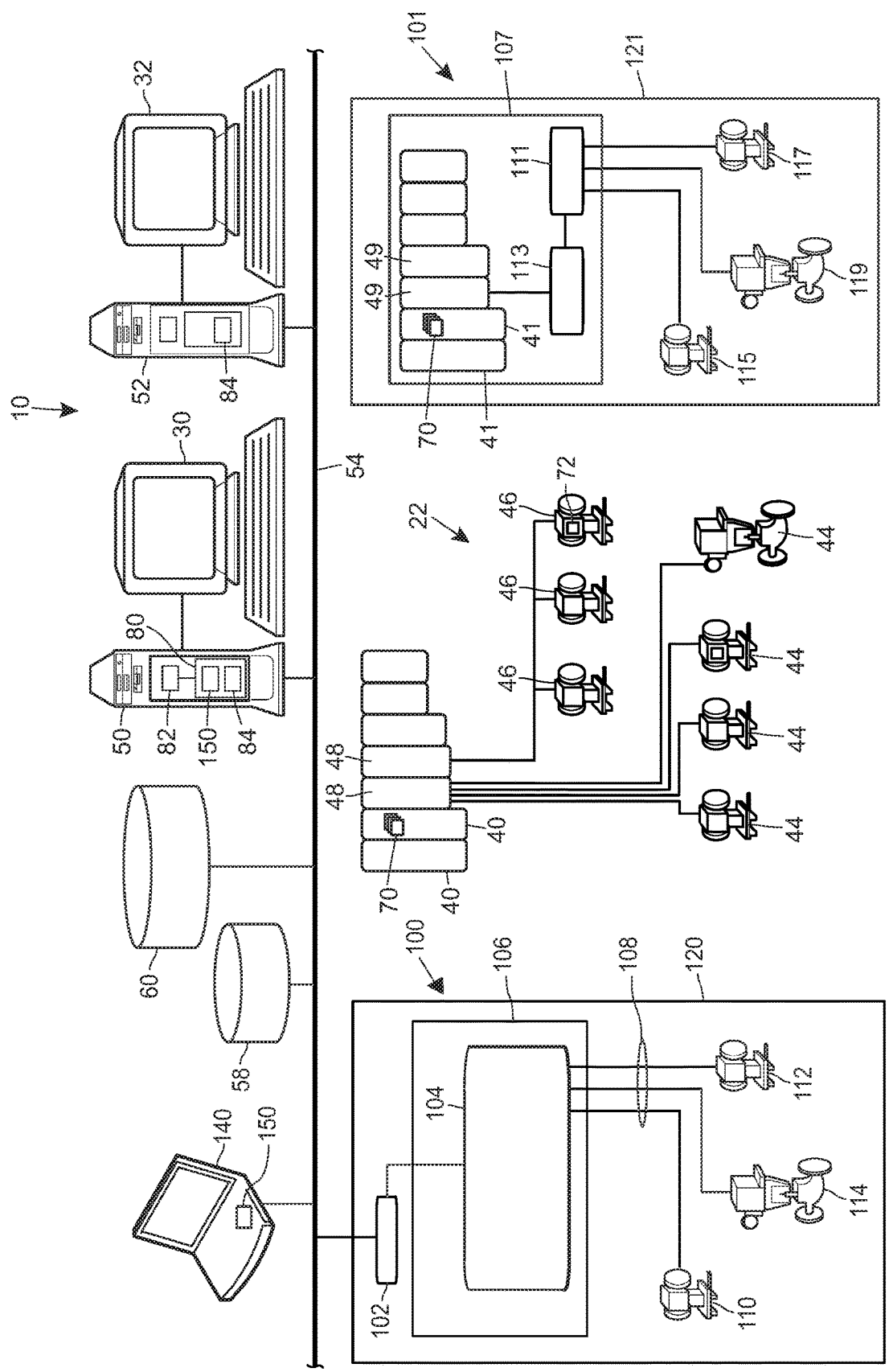
FIG. 1 is a block diagram of a distributed process control system including retrofitted and non-retrofitted legacy PLC control systems.

FIG. 1 illustrates an example process plant 10 that implements a native distributed control system 22, a legacy PLC control system 100, and a retrofitted control system 101. As is typical, the distributed process control system 22 has one or more controllers 40, each communicatively connected to one or more field devices or smart devices 44 and 46 via input/output (I/O) devices or I/O cards 48 which may be, for example, Fieldbus interfaces, Profibus interfaces, AS-Interface, DeviceNet, HART interfaces, standard 4-20 mA interfaces, etc. The controllers 40 are also coupled to one or more host or operator workstations 50, 52 via a communications backbone 54 which may be, for example, an Ethernet link or another link suitable local area network (LAN) link. A process data database 58 may be connected to the communications backbone 54 and operates to collect and store parameter, status and other data associated with the controllers and field devices within the plant 10. During operation of the process plant 10, the process data database 58 may receive process data from the controllers 40 and, indirectly, devices 44-46 via the communications backbone 54.

A configuration database 60 stores the current configuration of the process control system 22 within the plant 10 as downloaded to and stored within the controllers 40 and field devices 44 and 46. The configuration database 60 stores process control functions defining the one or several control strategies of the process control system 22, configuration parameters of the devices 44 and 46, the assignment of the devices 44 and 46 to the process control functions, and other configuration data related to the process plant 10. The configuration database 60 additionally may store graphical objects to provide various graphical representations of elements the process plant 10. Some of the stored graphical objects may correspond to process control functions (e.g., a process graphic developed for a certain PID loop), and other graphical objects may be device-specific (e.g., a graphic corresponding to a pressure sensor).

The process plant 10 also can include other databases coupled to the communications backbone 54, not shown in FIG. 1 to avoid clutter. For example, a data historian can store events, alarms, comments and courses of action taken by operators. The events, alarms, and comments may pertain to individual devices (e.g., valves, transmitters), communication links (e.g., wired Fieldbus segments, Wireless HART communication links), or process control functions (e.g., a PI control loop for maintaining a desired temperature set point). Further, a knowledge repository can store references, operator logbook entries, help topics, or links to these and other documentation that operators and maintenance technicians may find useful when supervising the process plant 10. Still further, a user database can store information about users such as the operator and the maintenance technician. For each user, the user database can store, for example, his or her organizational role, an area within the process plant 10 with which the user is associated, work team association, etc.

Each of these databases can be any desired type of a data storage or collection unit having any desired type of memory and any desired or known software, hardware or firmware for storing data. Of course, the databases need not reside in separate physical devices. Thus, in some embodiments, some of these databases are implemented on a shared data processor. In general, it is possible to utilize more or fewer databases to store the data collectively stored and managed by the databases described above.

While the controllers 40, I/O cards 48 and field devices 44 and 46 are typically distributed throughout the sometimes harsh plant environment, the operator workstations 50 and 52 and the databases 58, 60, etc. are usually located in control rooms or other less harsh environments easily assessable by controller, maintenance, and various other plant personnel. However, in some cases, handheld devices may be used to implement these functions and these handheld devices are typically carried to various places in the plant.

As is known, each of the controllers 40, which may be by way of example, the DeltaV™ controller sold by Fisher-Rosemount Systems, Inc., stores and executes a controller application that implements a control strategy using any number of different, independently executed, control modules or blocks 70. Each of the control modules 70 can be made up of what are commonly referred to as function blocks wherein each function block is a part or a subroutine of an overall control routine and operates in conjunction with other function blocks (via communications called links) to implement process control loops within the process plant 10. As is well known, function blocks, which may be objects in an object oriented programming protocol, typically perform one of an input function, such as that associated with a transmitter, a sensor or other process parameter measurement device, a control function, such as that associated with a control routine that performs PID, fuzzy logic, etc. control, or an output function that controls the operation of some device, such as a valve, to perform some physical function within the process plant 10. Of course hybrid and other types of complex function blocks exist such as model predictive controllers (MPCs), optimizers, etc. While the Fieldbus protocol and the DeltaV system protocol use control modules and function blocks designed and implemented in an object oriented programming protocol, the control modules could be designed using any desired control programming scheme including, for example, sequential function block, ladder logic, etc. and are not limited to being designed and implemented using the function block or any other particular programming technique. Each of the controllers 40 may also support the AMS Device Manager of applications and may use predictive intelligence to improve availability and performance of production assets including mechanical equipment, electrical systems, process equipment, instruments, field and smart field devices 44, 46, and valves.

In the plant 10 illustrated in FIG. 1, the field devices 44 and 46 connected to the controllers 40 may be standard 4-20 mA devices, may be smart field devices, such as HART, Profibus, ASibus, DeviceNet, or FOUNDATION™ Fieldbus field devices, which include a processor and a memory, or may be any other desired type of devices. Some of these devices, such as Fieldbus field devices (labeled with reference number 46 in FIG. 1), may store and execute modules, or sub-modules, such as function blocks, associated with the control strategy implemented in the controllers 40. Function blocks 72, which are illustrated in FIG. 1 as being disposed in one of the Fieldbus field devices 46, may be executed in conjunction with the execution of the control modules 70 within the controllers 40 to implement process control, as is well known. Of course, the field devices 44 and 46 may be any types of devices, such as sensors, valves, transmitters, positioners, etc. and the I/O cards 48 may be any types of I/O cards conforming to any desired communication or controller protocol such as HART, Fieldbus, Profibus, etc.

The workstations 50 and 52 can include one or more processors 82 that execute instructions stored in memory 80. The instructions can implement, in part, a viewing application 84 that provides various displays during operation of the process plant 10 to enable the operator 12 to view and control various operations within the process plant 10 or, as is common in larger plants, within a section of the process plant 10 to which the corresponding operator is assigned. The viewing application 84 may include, or cooperate with, support applications such as control diagnostic applications, tuning applications, report generation applications or any other control support applications that may be used to assist the operator in performing control functions. Further, the viewing application 84 can permits a maintenance technician to supervise the maintenance needs of the plant 10, e.g., to view the operating or working conditions of various devices 40, 44, and 46. The viewing application also may include support applications such as maintenance diagnostic applications, calibration applications, vibration analysis applications, report generation applications or any other maintenance support applications that may be used to assist the maintenance technician in performing maintenance functions within the plant 10.

With continued reference to FIG. 1, an example legacy PLC control system 100 controls field devices in a section 120 of the process plant 10. The example legacy PLC control system 100 includes a legacy PLC 102, termination and I/O hardware 104 in a mounting rack/chassis 106, and field devices 110-114 coupled to the termination and I/O hardware 104 by legacy wiring 108. While FIG. 1 depicts only a single legacy PLC control system 100 in the process plant 10, a given process plant may have any number of legacy PLCs controlling corresponding field devices in portions of the process plant.

Similarly, FIG. 1 also depicts a retrofitted control system 101. The retrofitted control system 101 controls field devices in a section 121 of the process plant 10 and includes controllers 41 and I/O modules 49 disposed in a mounting rack/chassis 107 that is the same size as the mounting rack/chassis of the legacy system that was retrofitted (e.g., the same size as the mounting rack/chassis 106). The retrofitted control system 101 also includes, disposed in the mounting rack 107, termination hardware 111 and custom interface hardware 113, through which signals from field devices 115-119 are communicated to the I/O cards 49 and, in turn, to the controllers 41. While FIG. 1 depicts only a single retrofitted control system 101 in the process plant 10, a given process plant may have any number of retrofitted control systems controlling corresponding field devices in portions of the process plant.

Figure 2A:
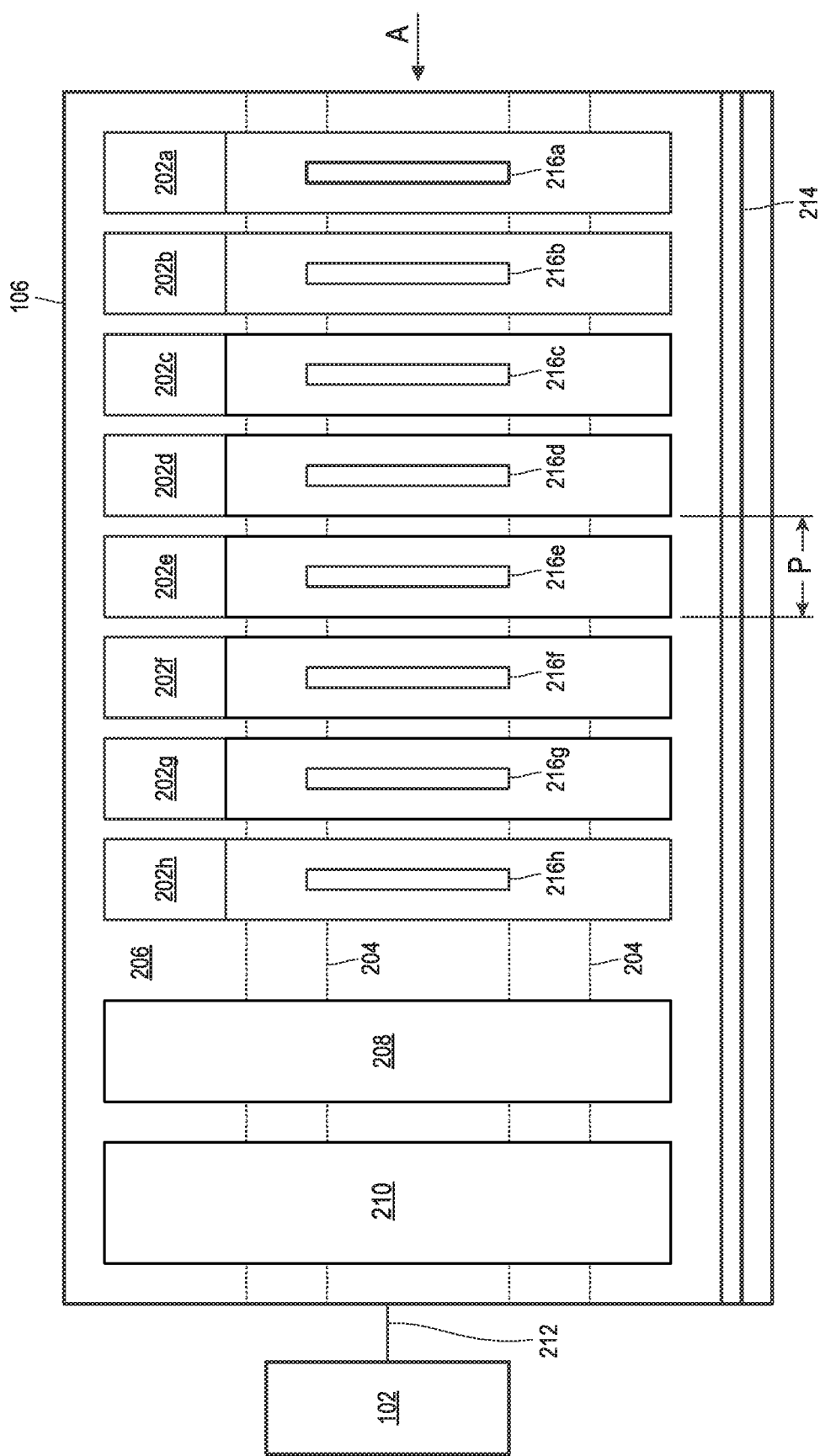
FIG. 2A illustrates an example I/O chassis for a legacy PLC control system.

FIG. 2A illustrates an example I/O chassis for a legacy PLC control system such as the legacy PLC control system 100 depicted in FIG. 1 and, in particular, illustrates the organization of the termination and I/O hardware 104 in the mounting rack/chassis 106. Generally, the mounting rack/chassis 106 is configured to receive, via legacy wiring (shown in FIG. 2B), signals from the field devices 110-114 controlled by the legacy PLC control system 100. The legacy wiring is generally organized by I/O type, such that inputs from the field devices are grouped together, outputs to the field devices are grouped together, etc. The legacy wiring is also generally organized according to the signal type, such that analog signal types are grouped together and discrete signal types are grouped together. Other organizational schemes may be used in some instances, but, in general, the signals are grouped such that each set of signals may be communicatively coupled to a single I/O card.

Correspondingly, the mounting rack/chassis 106 includes a plurality of I/O cards 202a-h. Each of the I/O cards 202a-h may be, for example, an analog input card, an analog output card, a discrete input card, a discrete output card, etc. The numbers and types of I/O cards depends on the on number and types of inputs and outputs required by the portion of the process plant controlled by the legacy PLC control system 100. In the embodiment depicted in FIG. 2A, for example, the mounting rack/chassis 106 includes eight I/O cards 202a-h. Additionally, the each of the I/O cards 202a-h may be multi-channel I/O cards, as would be generally understood. For instance, the I/O cards 202a-h may each be 8-channel, 16-channel, or 32-channel cards, capable of coupling, respectively, to 4, 8, 16, or 32 input or output wires of the legacy wiring.

Figure 2B:
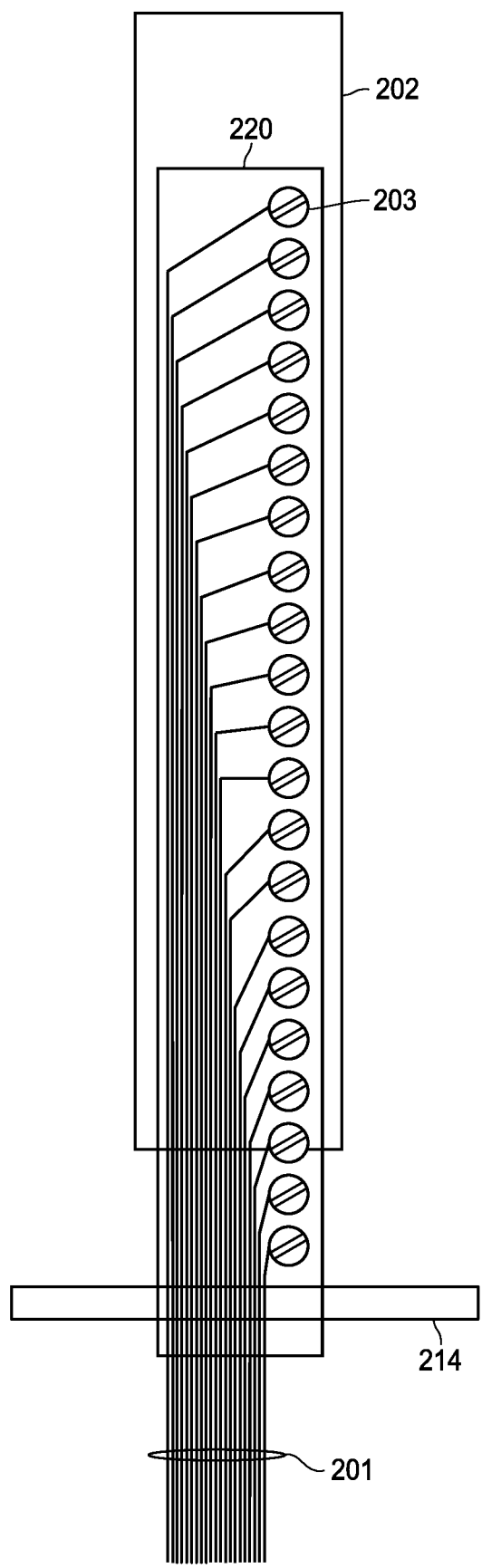
FIG. 2B illustrates a swing-arm coupled to legacy field device wiring.

An example of the legacy wiring is illustrated in FIG. 2B. A single one of the I/O cards 202 is depicted in FIG. 2B, in physical and electrical connection with a swing-arm 220 carrying legacy wiring 201. The swing-arm 220 illustrated in FIG. 2B includes 21 terminals 203, each terminal having terminated thereon a wire of the legacy wiring 201. The swing-arm 220 is depicted as mounted on a swing-arm rod 214, about which the swing-arm 220 is pivotable as described below and as illustrated in FIG. 3.

Turning back to FIG. 2A, the I/O cards may be mounted on one or more mounting rails (e.g., DIN rails or any proprietary mounting mechanism) 204 in the mounting rack 106, and are communicatively coupled to a backplane 206 that facilitates communication between the I/O cards 202a-h and a remote I/O adapter 208. A power adapter 210 may provide power to the hardware in the mounting rack/chassis 106, including the I/O cards 202a-h and the remote I/O adapter 208.

The remote I/O adapter 208 may be generally responsible for routing signals between the various I/O cards 202a-h and the legacy PLC 102. That is, the remote I/O adapter 208 may receive from the legacy PLC 102 the various output signals destined for the field devices 110-114 and route the signals, as appropriate, to the various I/O cards 202a-h so that each signal reaches the appropriate device. Similarly, the remote I/O adapter 208 may receive signals from the I/O cards 202a-h and communicate the signals to the legacy PLC 102.

The backplane 206 and/or a communications link (e.g., an Ethernet connection, an RS-232/485 connection, proprietary protocol, etc.) 212 may provide communication between the remote I/O adapter 208 and the legacy PLC 102. In some instances, the legacy PLC 102 may be located remotely from the mounting rack/chassis 106. Accordingly, the communication link 212 may communicatively couple the legacy PLC 102 directly to the remote I/O adapter 208 or, in alternate embodiments, the communication link 212 may communicatively couple the legacy PLC 102 to a port (not shown) on the backplane 206, and the backplane 206 may provide the communication link to the remote I/O adapter 208 and, thus, to the I/O cards 202a-h.

In embodiments and, in particular, in the embodiment depicted in FIG. 2A, the mounting rack/chassis 106 includes a cylindrical swing-arm rod 214 that serves as an axle, about which a plurality of swing-arms (not depicted in FIG. 2A, but one of which is depicted in FIG. 2B) can pivot to selectively couple or decouple the I/O cards 202a-h from the legacy wiring via connectors 216a-h on the I/O cards 202a-h and corresponding connectors on the swing-arms, as will become apparent with reference to FIG. 3.

FIG. 3 illustrates a side view (from direction A, as depicted in FIG. 2A) of the mounting rack/chassis 106, and depicts in profile the arrangement of a single one 202 of the I/O cards 202a-h within the mounting rack/chassis 106. Also depicted in profile in FIG. 3 is a swing-arm 220. The swing-arm 220 has an aperture 222 or an arc-shaped clip 223 (see FIG. 4) sized to accept the swing-arm rod 214 such that the swing-arm 220 rotates about the swing-arm rod 214 with little or no non-rotational movement. That is, the swing-arm 220 cooperates with the swing-arm rod 214 to allow the swing-arm 220 to pivot toward and away from the I/O card 202 with little to no movement of the swing-arm 220 along the length of the swing-arm rod 214, and little or no space between the inner surface of the aperture 222 (or clip 223) and the outer surface of the swing-arm rod 214. While FIG. 3 depicts only a single swing-arm 220, it should be understood that the mounting rack/chassis 106 and, in particular, the swing-arm rod 214, may carry a plurality of swing-arms 220 and, specifically, may carry one swing-arm 220 for each of the plurality of I/O cards 202 (e.g., a swing-arm for each of I/O cards 202a-h). Advantageously, in embodiments employing swing-arms having the clip 223 (as depicted in FIG. 4), the swing-arm 220 may be removed from the swing-arm rod 214 to facilitate access to the remaining hardware in the mounting rack/chassis 106.

The swing-arm 220 in FIG. 3 is depicted as having a connector 224 that corresponds to a connector 216 on the I/O card 202. The connector 224 is disposed on the swing-arm 220 so that as the swing-arm 220 rotates about the swing-arm rod 214, the connector 224 on the swing-arm 220 is aligned with the connector 216 on the I/O card 202 as the two connectors 216, 224 come into contact. The connectors 216, 224 may respectively be male and female (or vice versa) sides of any type of connector known in the art and suitable for carrying the types of signals communicated between the I/O card 202 and the field devices 110-114. Thus, though not typical, the connectors 216, 224 used for each swing-arm 220 may be different depending on the types of signals carried by the wiring coupled to the swing-arm 220 and to the connectors 224, 216. The connectors 216, 224 may be, by way of example, contact type connectors (also known as "Tulip" connectors), card-edge connectors, etc.

Figure 5:
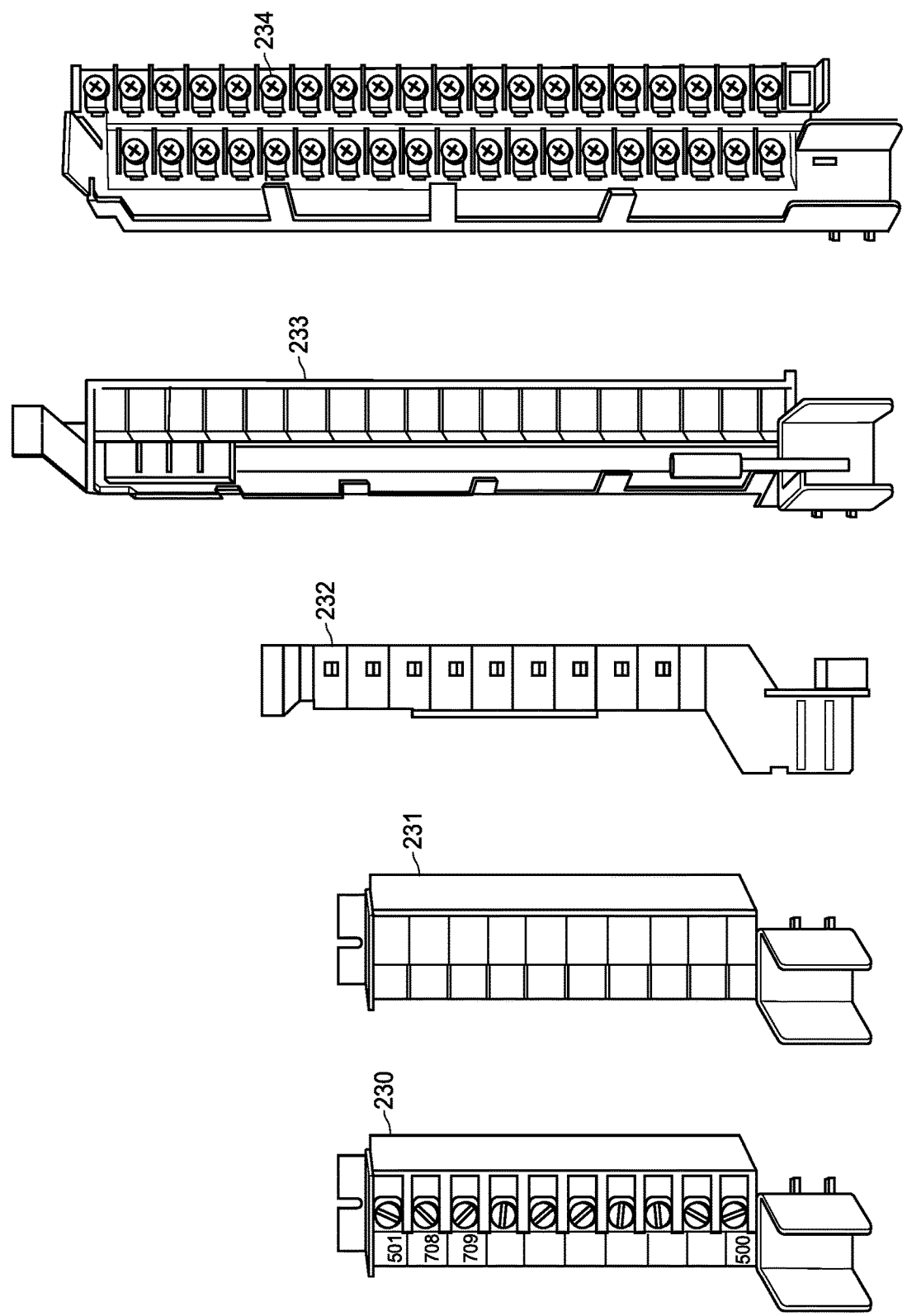
FIG. 5 shows a plurality of swing-arms of different styles and numbers of terminals.

Each of the swing-arms 220 may be any type of swing-arm generally known and/or employed in the process control arts. By way of example, FIG. 5 shows a plurality swing-arms 230-234 (viewed from direction B, as depicted in FIG. 3) having different numbers of terminals to which legacy wiring from field devices may be terminated. Respectively, the swing-arms 230-234 have 10, 10, 18, 21, and 40 terminals. Though the depicted swing-arms 230-234 employ screw-type terminals (i.e., contacts in which a bare wire or ferruled wire end is placed under the screw and the screw tightened to force the wire end into contact with a metal contact), other embodiments may use other types of terminals, but nevertheless accomplish the function of creating and maintaining an electrical connection between a wire carrying a signal to/from a field device and a corresponding electrical contact on the connector 224.

Figure 6:
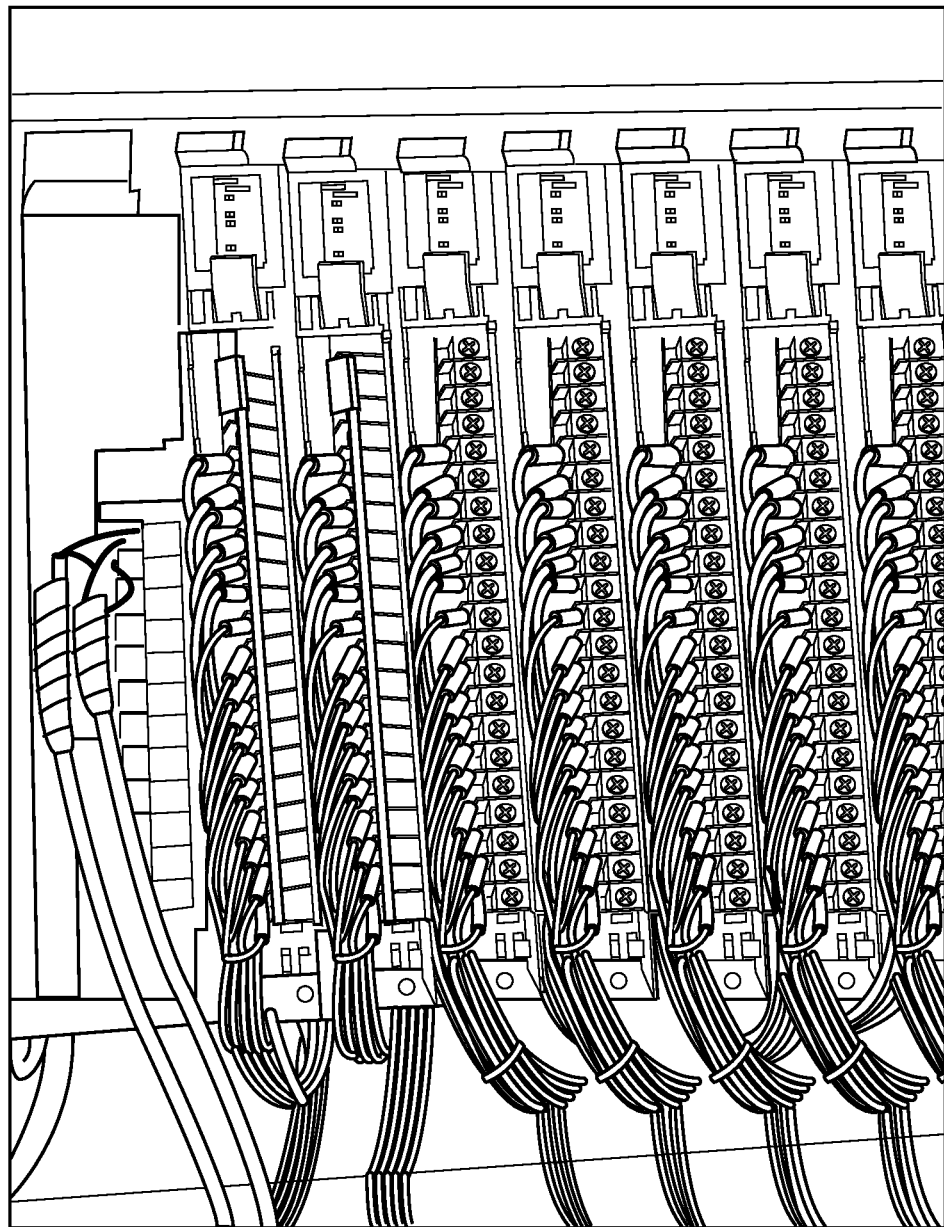
FIG. 6 shows a plurality of swing-arms having wiring connected to them.

FIG. 6 shows a plurality of swing-arms having wiring terminated thereto.

Figure 7:
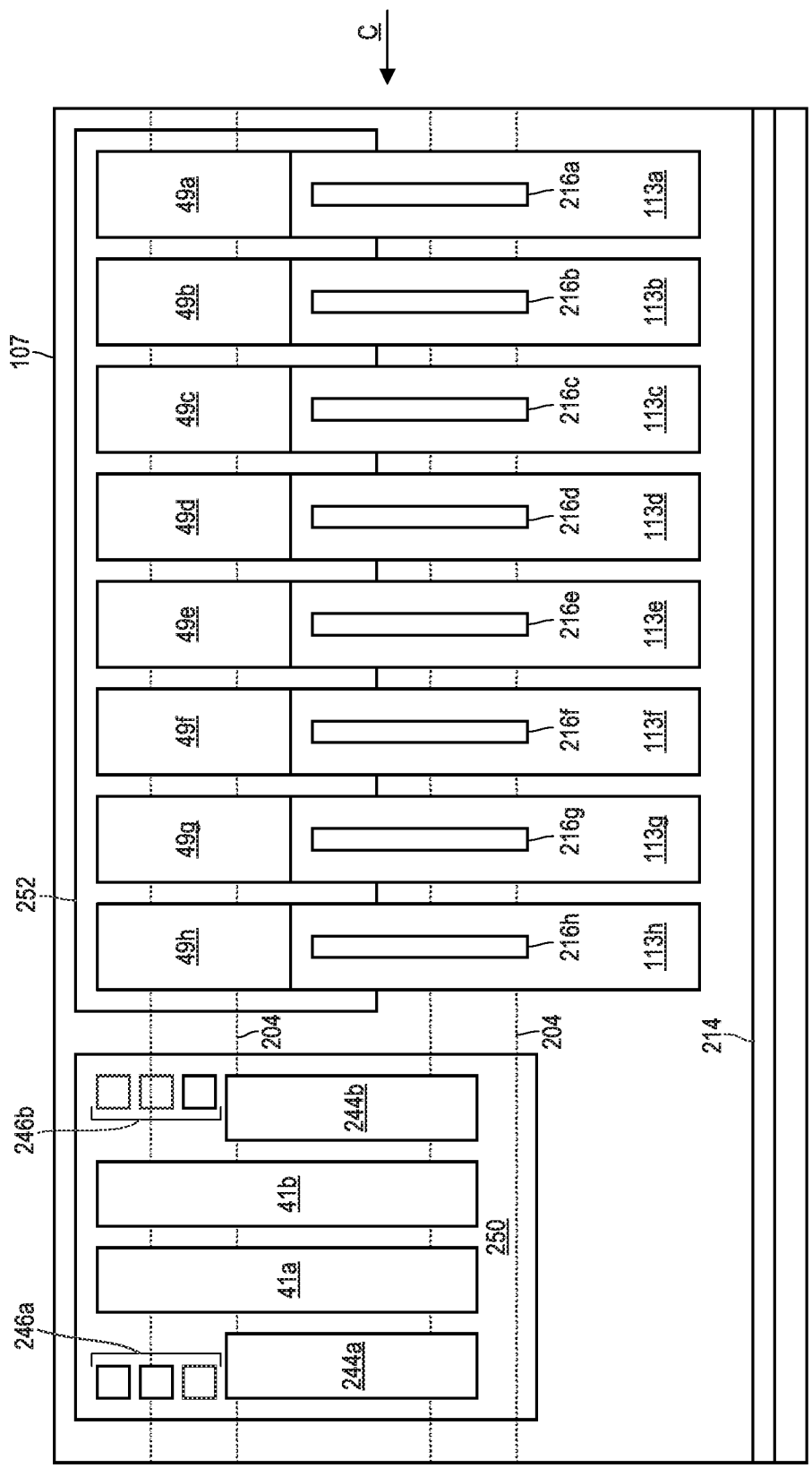
FIG. 7 is a block diagram of an example I/O chassis for retrofitting a control system according to this disclosure.

Turning now to FIG. 7, a block diagram of an example I/O rack for a retrofitted control system, such as the retrofitted control system 101 depicted in FIG. 1, is shown. Specifically, FIG. 7 illustrates the organization of the hardware in the mounting rack 107. The mounting rack may have the same, or nearly the same, dimensions as the mounting rack/chassis 106 of the legacy PLC control system 100, such that the mounting rack 107 may be substituted for the mounting rack/chassis 106 during the retrofitting/upgrading process.

Generally speaking, the mounting rack 107 includes hardware for coupling the legacy wiring on the swing-arms 220 (or other legacy wiring mechanisms), present on legacy PLC-based systems being retrofitted, to the non-PLC based distributed process controller. For every swing-arm 220, for instance, the mounting rack 107 includes a corresponding piece of hardware to communicatively couple the connector on the swing-arm 220 (e.g., the connector 224) to the distributed process controller (via other hardware). The corresponding piece of hardware to which the swing-arm 220 connects in the mounting rack 107 has a corresponding connector, such that, for example, if the swing-arm 220 is fitted with a "male" card-edge connector, the corresponding piece of hardware includes a "female" card-edge connector. Of course, the mounting rack 107 also includes a swing-arm rod 214 in embodiments employing swing-arms.

The mounting rack 107 also generally includes I/O cards compatible with the distributed process controller. As will be described below, the I/O cards generally replace one or more I/O cards of the legacy PLC-based system.

Referring again to FIG. 7, the mounting rack 107 includes a plurality of custom interface modules 113a-h. The custom interface modules 113a-h each have disposed on a front (i.e., outward facing) surface a connector that corresponds to a swing-arm or other legacy wiring mechanism to which the connector is expected to couple. As such, for a mounting rack 107 configured to replace the mounting rack 106 described above, the connectors on the custom interface modules 113a-h would be the same connectors 216a-h present on the I/O cards 202a-h. Of course, it should be appreciated that the connectors 216a-h on the custom interface modules 113a-h need only be identical to the connectors 216a-h on the I/O cards 202a-h and, as should be apparent, do not need to be removed from the I/O cards 202a-h to be fitted to the custom interface modules 216a-h. The connectors 216a-h on the custom interface modules 113a-h are disposed such that when the swing-arm 220 is rotated about the swing-arm rod 214, the connector 224 electrically and mechanically couples to the corresponding connector 216 present on custom interface module.

As described above, the legacy wiring may be rigid and/or brittle due to age and environment conditions and, accordingly, it may be desirable to limit the movement of the legacy wiring during while performing the retrofit and/or may not be possible to move the wiring significantly. Thus, while a custom interface module may be positioned in the mounting rack 107 so as to have some minor lateral offset from the corresponding position of the I/O card 202 it replaces, that offset is limited by the ability of the legacy wiring mechanism to accommodate the offset by, for example, minor movement of the swing-arm 220 along the swing-arm rod 214.

Each of the custom interface modules 113a-h is communicatively coupled to one or more I/O cards 49a-h. The I/O cards 49a-h are, preferably, standard I/O cards used in the distributed process controller-based system, and the custom interface modules 113a-h condition the signals between the I/O cards 49a-h and the legacy wiring going to the field devices 115-119 as will be described in greater detail below. The I/O cards 49a-h may be communicatively and physically coupled to an I/O card carrier 252. Generally, the I/O carrier 252 is configured to accept some number of I/O cards 49. In various embodiments, for example, the I/O carrier 252 is configured as a 2-wide, a 4-wide, a 6-wide, or an 8-wide I/O carrier 252, able to carry and interface with up to 2, 4, 6, or 8 I/O cards 49, respectively. By way of example, the mounting rack 107 depicted in FIG. 7 would necessarily include an 8-wide I/O carrier 252. In any event, the I/O carrier 252 provides power (from an external power source, in embodiments) to the I/O cards 49, in addition to carrying signals from the plurality of I/O cards 49 to the controller module 250.

In embodiments, the mounting rack 107 also includes a distributed process controller (e.g., the process controller 41, depicted in FIG. 1). FIG. 7, depicts two redundant distributed process controllers 41a and 41b, as well as associated power modules 244a and 244b, each controlling a set of communication ports (e.g., Ethernet ports) 246a and 246b, respectively. As depicted in FIG. 7, the controllers 41a, 41b, the power modules 244a, 244b, and the communication ports 246a, 246b, may all be part of a controller module 250. The controller module 250 may be coupled to the I/O cards via a backplane/carrier (not shown) or by any other known method.

While depicted in FIG. 7 as having eight I/O cards 49a-49h, it should be understood that the number of I/O cards may be dependent on the number of I/O channels required and/or on the number of legacy wiring mechanisms present (which corresponds to the number of custom interface modules). FIG. 7 illustrates eight custom interface modules 113a-h and eight corresponding I/O cards 49a-h, implying to the casual observer that each of the I/O cards 49a-h is associated with a corresponding one of the custom interface modules 113a-h and, therefore, has the same (or greater) number of channels as the number of inputs or outputs on the legacy wiring mechanism (e.g., the swing-arm 220) coupled to the custom interface module. However, while it may be the case, in some embodiments, that each of the custom interface modules is associated with a corresponding one of the I/O cards, in other embodiments one I/O card may be associated with (and communicatively coupled to) more than one of the custom interface modules, as will become apparent with respect to, for example, FIGS. 9-12.

Figure 8:
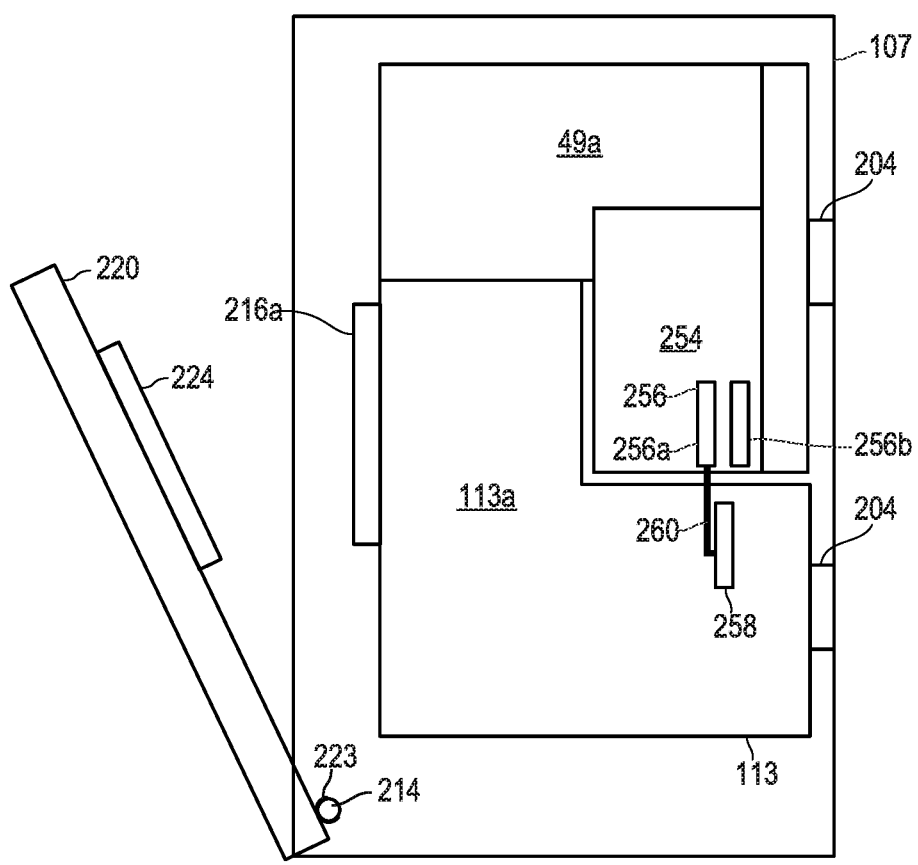
FIG. 8 is a side view of the I/O chassis of FIG. 7.

The relationships between the components in the mounting rack may be more readily visualized with reference to FIG. 8, which illustrates a view of the mounting rack 107 from the direction "C" in FIG. 7. In embodiments, the I/O carrier 252 is mounted in the mounting rack 107 using a mounting mechanism such as the DIN rails 204. I/O cards 49 are physically and electrically coupled to the I/O carrier card 252. Each of the I/O card 49 may any standard (or non-standard) number of channels for receiving or sending any corresponding number of signals. Typical I/O cards have 8, 16, or 32 channels per I/O card 49. Accordingly, depending on the number of channels present on the legacy wiring connection mechanism (e.g., the swing-arm 220), a single one of the I/O cards 49 may be capable of handling the channels associated with one, two, or more of the swing-arms 220. For instance, if each swing-arm 220 carries 16 channels, and each I/O card 49 is a 32-channel I/O card, then each I/O card 49 can accommodate the signals on two swing-arms 220.

As one might appreciate, then, there must be a mechanism, in some embodiments, to communicatively couple signals from two swing-arms 220 to a single one of the I/O cards 49. Each swing-arm 220 couples, via the connectors 224 and 216, the signals on the legacy wiring to a custom interface module 113 configured to accept the signals on that legacy wiring. Accordingly, in such embodiments it is desirable to communicatively couple multiple custom interface modules 113 to a single I/O card 49. Thus, in embodiments, the I/O carrier 252 also is configured as having one or more associated I/O mass-connection terminal blocks 254. The I/O terminal block 254 provides a standardized interface between the I/O cards 49 and the custom interface modules 113 the latter of which, as described, may vary depending on the type of the connector 216, the types of signals being carried to/from the I/O card 49, the number of channels on each custom interface module 113, and the like. Each custom interface module 113 may be communicatively coupled to an I/O terminal block that, in turn, communicates the plurality of signals processed by the custom interface module 113 to the associated I/O card 49.

With that purpose in mind, in embodiments, the I/O terminal block 254 has disposed thereon one or more connectors 256 that facilitate communicative coupling between the I/O terminal block 254 and the custom interface module 113. Similarly, the custom interface module 113 has disposed thereon a corresponding connector 258. The I/O terminal block 254 depicted in FIG. 8, for example, includes two such connectors 256a and 256b, so that it can provide communication to a single I/O card 49 from two custom interface modules 113, allowing a single, 32-channel I/O card, for instance, to handle signals handled in the PLC-based system by two 16-channel I/O cards. While any suitable wiring may be employed between the connector 258 on the custom interface module 113 and the connector 256 on the I/O terminal block 254, in embodiments, a ribbon cable connector 260 is employed. Due to the compact nature of the installations, it may be desirable, in embodiments, to use a coiled ribbon connector for short lengths and standard ribbon cable for longer lengths outside the I/O mounting rack 107.

FIG. 8 also illustrates that the custom interface modules 113 have a form factor that allows them to fit into the mounting rack 107 in a manner that does not impede the removal of the I/O cards 49, for instance, for the purpose of replacement or other maintenance. Additionally, in embodiments, the I/O cards 49 may also be removable without disconnecting the swing-arms 220 from the custom interface modules 113.

Referring again to FIG. 7, while each of the custom interface modules 113a-h is depicted as having a width approximately equal to that of the I/O cards 49a-h, it should be understood that the custom interface modules 113a-h may be narrower or wider than the I/O cards 49a-h, in various embodiments. The only requirement is that the width of the custom interface modules 113a-h not exceed the pitch, P (i.e., the spacing between corresponding edges of two adjacent cards), of the I/O cards 202a-h (see FIG. 2A). That is, the custom interface modules 113a-h must be able to be positioned in the mounting rack 107 to match the position of the swing-arms 220.

Figure 9:
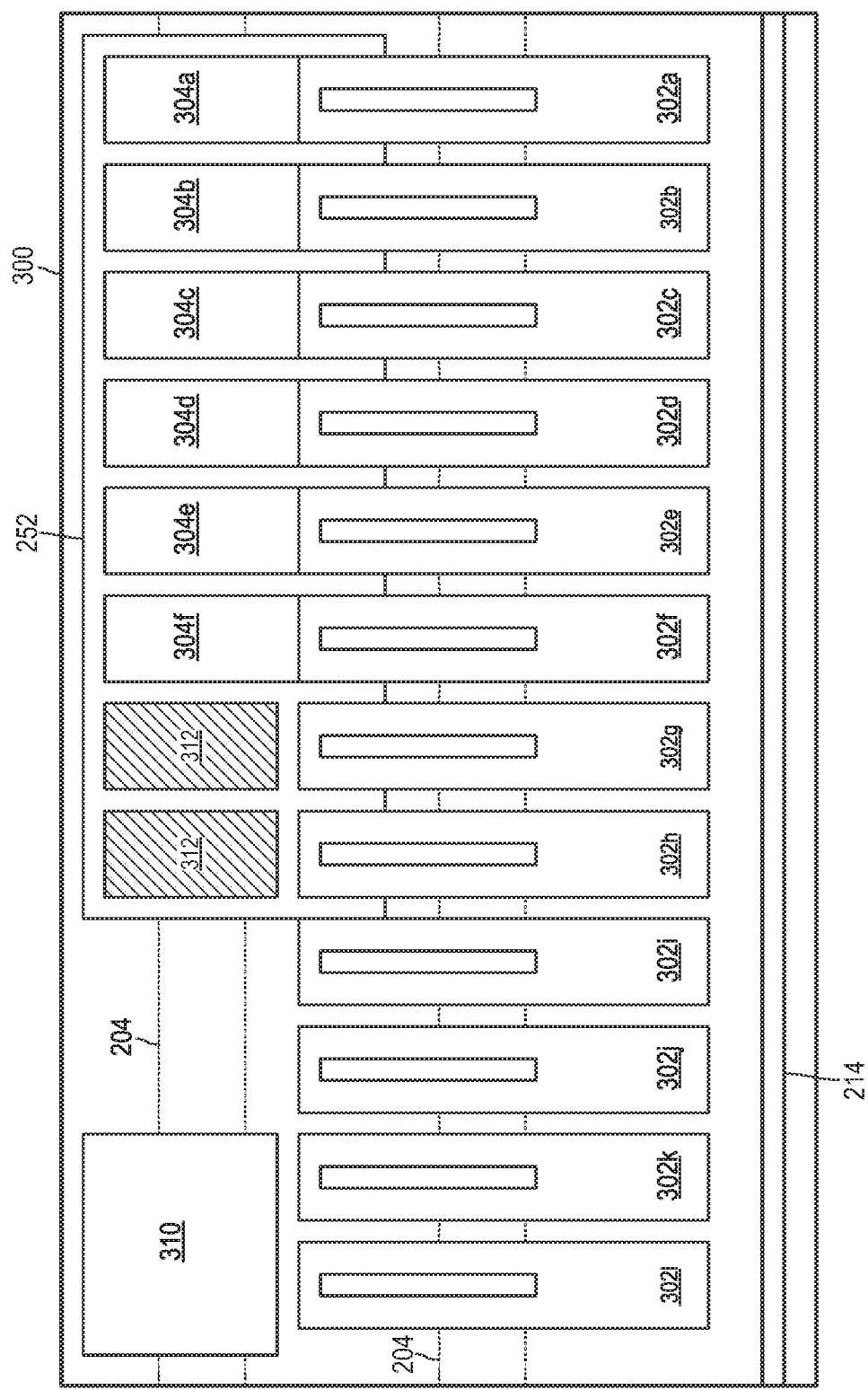
FIG. 9 shows an alternate embodiment of an I/O chassis for retrofitting a control system.

In some embodiments, the mounting rack/chassis 106 to be replaced by the mounting rack 107 includes I/O cards 202 along its entire width and, accordingly, the retrofit mounting rack 107 would likewise require I/O cards 113 across its entire width so that each of the swing-arms 220 present has a corresponding I/O card 113. FIG. 9 illustrates one such embodiment. In FIG. 9, a retrofit mounting rack 300 is configured to replace a legacy PLC rack (not shown) in which 12 legacy I/O cards (not shown) were each connected to corresponding swing-arms (not shown), taking up the entire width of the corresponding mounting rack (not shown). As a result, the mounting rack 300 includes 12 custom interface modules 302a-l. However, in the embodiment depicted in FIG. 9, I/O cards 304a-f can each accommodate signals from two of the custom interface modules and, accordingly, only one I/O card 304a-f is needed for every two custom interface modules 302a-l. Custom interface modules 302a-b may be communicatively coupled, for example, to I/O card 304a, custom interface modules 302c-d may be coupled to I/O card 304b, etc. Of course, there is no requirement that each I/O card 304a-f be communicatively coupled to custom interface modules 302a-l that are adjacent to one another or adjacent to the I/O card 302a-f to which they are coupled. As a result, the I/O carrier 252 is populated with only six I/O cards (i.e., the I/O card 304a-f), leaving two empty positions 312 in which I/O cards are not present.

In embodiments such as that depicted in FIG. 9, in which custom interface modules 302a-l occupy most or all of the width of the mounting rack 300, there may be insufficient space for the controller module assembly. Accordingly, in some embodiments the controller module 250 may be located outside of and/or remotely from the mounting rack 300. Instead, a carrier extender module 310 may be mounted in (or immediately adjacent to) the mounting rack 300. The carrier extender module 310 may be communicatively coupled to the I/O carrier 252, to facilitate communication of the signals between the I/O cards 304a-f and the controller module 250. The carrier extender module 310 may be communicatively coupled to the controller module 250 by any communication medium, but in some embodiments a communications cable(s) is/are employed between the controller module 250 and the carrier extender module 310.

Figure 10:
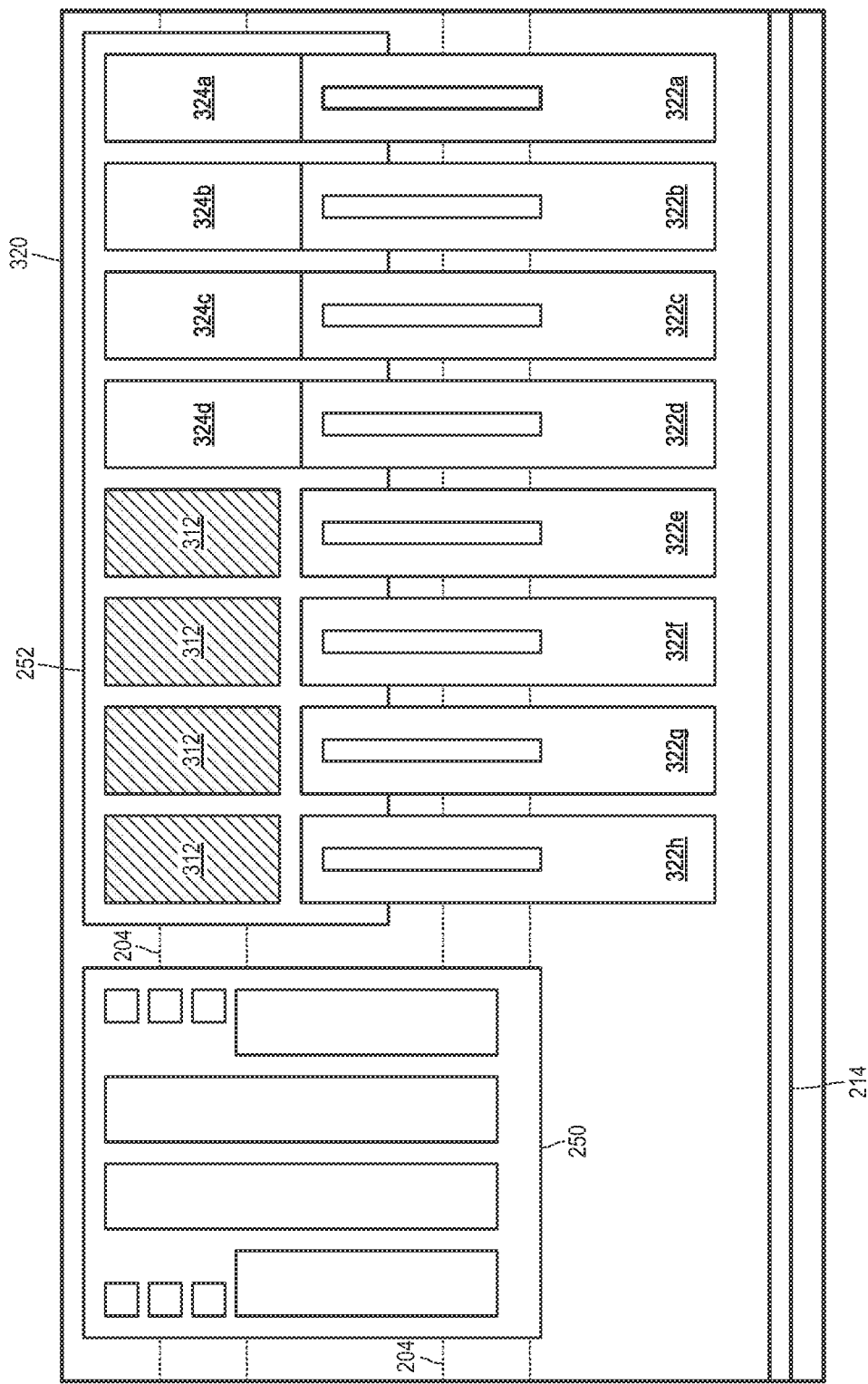
FIG. 10 shows yet another alternate embodiment of an I/O chassis for retrofitting a control system.

FIG. 10 illustrates another embodiment. In FIG. 10, a mounting rack 320 includes a controller module 250, an eight-wide I/O card carrier 252, and eight custom interface modules 322a-h. The I/O carrier 252 is fitted with four I/O cards 324a-d, each of which is communicatively coupled to a respective pair of the custom interface modules 322a-h. (The I/O cards may each be 32-channel I/O cards and the custom interface modules coupled to swing-arms carrying 16 channels, or the I/O cards may each be 16-channel I/O cards and the custom interface modules coupled to swing-arms carrying 8 channels, etc.) Thus, because only four I/O cards 324a-d are required in the depicted embodiment, the eight-wide I/O card carrier 252 has four empty positions 312 in FIG. 10.

Figure 11:
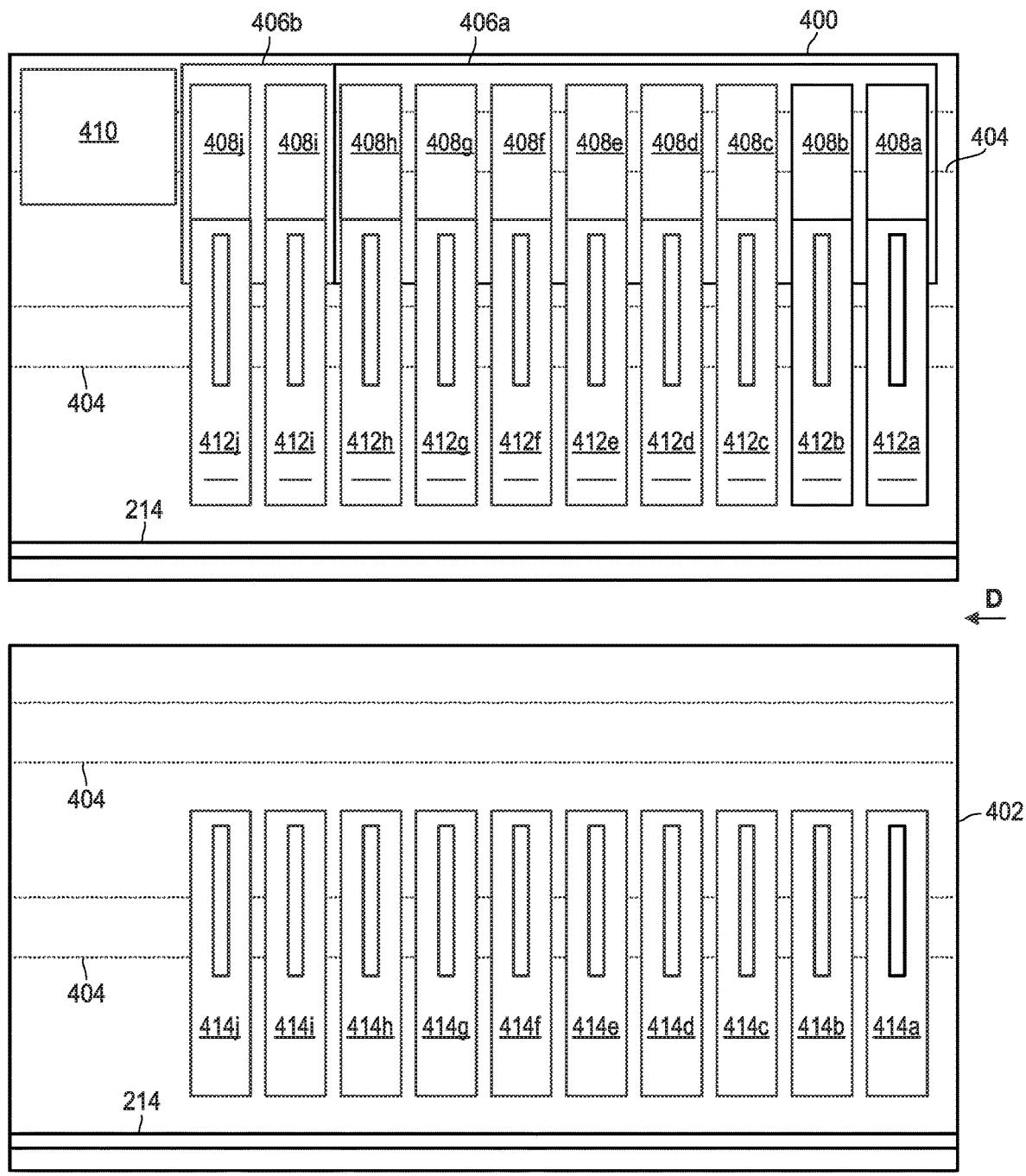
FIG. 11 shows still another embodiment of an I/O chassis for retrofitting a control system.
Figure 12:
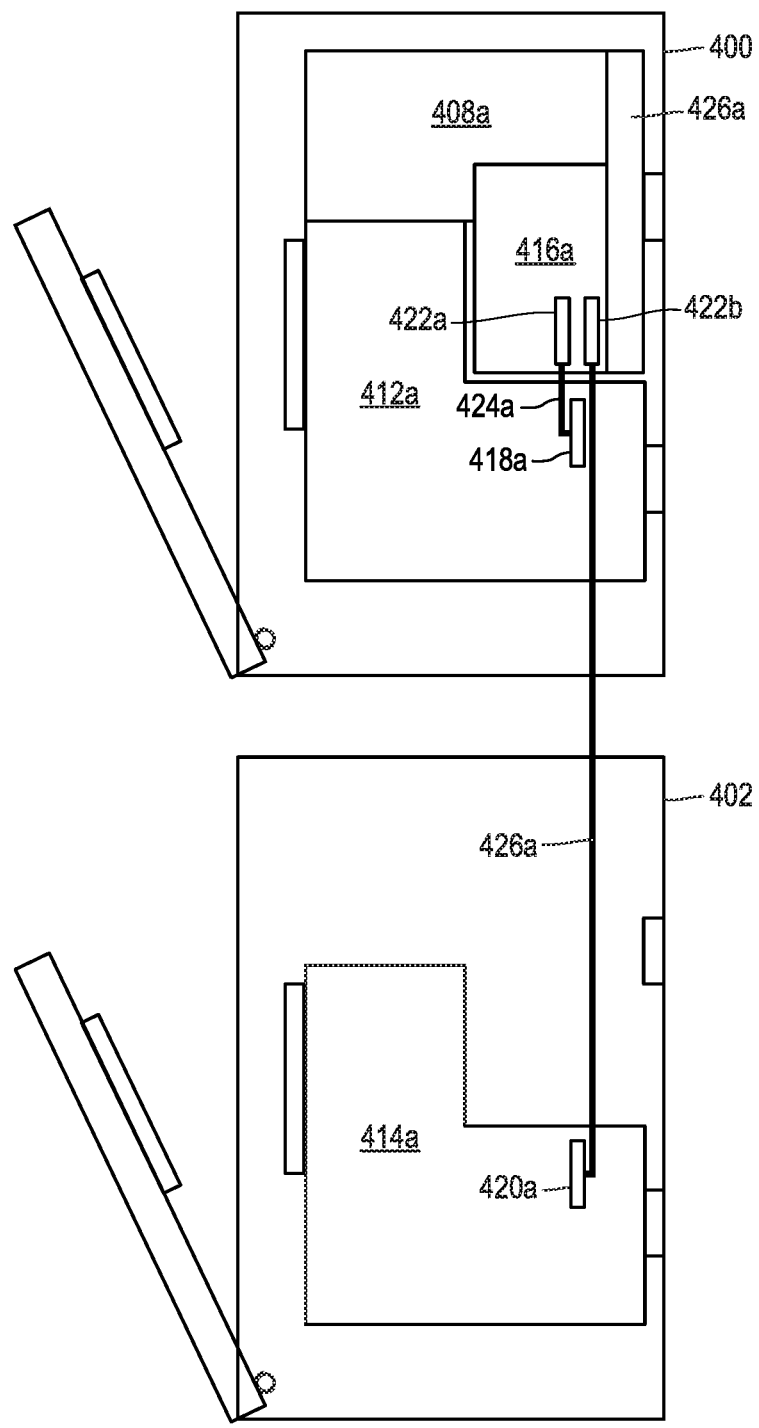
FIG. 12 depicts a side view of the embodiment of FIG. 11.

Frequently in process control systems, legacy wiring is brought into multiple racks that may be disposed adjacent to one another—above and below, or side by side, for example. In such cases, yet another embodiment of the retrofit solution is contemplated, as depicted in FIGS. 11 and 12. FIGS. 11 and 12 show two retrofitted mounting racks 400 and 402 that would replace two similarly situated legacy mounting racks (not shown). As in previously described embodiments, the mounting rack 400 includes an eight-wide I/O carrier 406a, populated with eight I/O cards 408a-h. An additional two I/O cards 408i-j populate a second, four-wide I/O carrier 406b, providing a total of 10 I/O cards 408a-j. The mounting rack 400 also includes 10 custom interface modules 412a-j, each communicatively coupled to one of the I/O cards 408a-j. Lastly, the mounting rack 400 includes a carrier extender 410, configured to be communicatively coupled to a controller module (not shown) such as the controller module 250 described with respect to FIG. 7. At the same time, the mounting rack 402 includes 10 custom interface modules 414a-j. Each of the custom interface modules 414a-j is communicatively coupled to one of the I/O cards 408a-j in the mounting rack 400. (In this embodiment, it is contemplated that each of the I/O cards 408a-j has twice as many channels as each of the custom interface modules 414a-j).

With reference to FIG. 12, which depicts the mounting racks 400 and 402 viewed from the direction "D" in FIG. 11, showing the right-most components 412a, 414a, 408a, etc., each of the custom interface modules 412a-j and 414a-j has a respective connector 418a-j or 420a-j. Similarly, the I/O terminal blocks 416a-j each have a pair of connectors 422a, 422b. The connectors 418a-j and 420a-j facilitate communicative coupling of the signals custom interface modules 412a-j and 414a-j, respectively, to the I/O terminal blocks 416a-j. FIG. 12 depicts that the custom interface modules 412a and 414a are both communicatively coupled, by wiring (e.g., ribbon cables) 424a and 426a, respectively, to the I/O terminal block 416a associated with the I/O card 408a. In the depicted embodiment, custom interface modules 412b and 414b would both be communicatively coupled, by wiring (e.g., ribbon cables), respectively, to the I/O terminal block associated with the I/O card 408b, etc. However, as described above, there is no requirement that the custom interface modules 412a-j and 414a-j be communicatively coupled to the I/O cards 408a-j in any particular manner. The particular custom interface modules coupled to a particular I/O card may be selected according to the types of signals, the organization of the control system, the physical layout of the process plant, or any other suitable criteria.

The embodiments described herein result in a solution for retrofitting a legacy PLC-based system that, for each retrofit, varies only in a small number of predictable ways:

Mounting Rack Size: The mounting racks/chassis 106 of legacy PLC-based systems generally come in only a handful of sizes for each PLC manufacturer and type. For instance, for a specific PLC manufacturer, the mounting racks/chassis 106 for the legacy systems may be available in 4-, 8-, 12-, and 16-card racks, each with a predetermined height, width, and depth. Each mounting rack also has a predetermined card pitch (the distance between the same point on two adjacent cards).

Number of channels per I/O card: Each of the I/O cards in the legacy mounting racks generally has one of several numbers of channels. For instance, in many cases, legacy I/O cards are 4-, 6-, 8-, 16-, or 32-channels.

Type of legacy wiring mechanism: Though swing-arms are typical, some legacy systems or installations may employ other connector mechanisms. Where swing-arms are used, they come in different form factors and different numbers of terminations (the latter of which is generally related to the number of channels on the legacy I/O card).

Type of connectors coupling the legacy wiring mechanism to the legacy I/O card: Various connectors exist for coupling the wiring mechanisms to the legacy I/O cards, as described above. Typical examples of connectors include card-edge connectors and contact ("tulip") connectors, and each manufacturer typically uses only one or two different types of connectors.

Vertical position of the connectors in the mounting rack: This is generally related to the legacy I/O card design and the swing-arm type.

Once the particulars of the legacy PLC-based system are known, a retrofit (i.e., replacement) mounting rack may be assembled according to the parameters of the legacy system. The retrofit mounting rack size may be selected and the retrofit mounting rack populated with an I/O carrier or carriers sufficient to carry the number of I/O cards necessary to support the number of I/O cards on the legacy system. For example, if the legacy system included in a single rack 16, 16-channel I/O cards, the retrofit mounting rack might include an eight-wide I/O carrier, populated with eight, 32-channel I/O cards, and 16 custom interface modules (one for each of the legacy wiring mechanisms).

Figure 13:
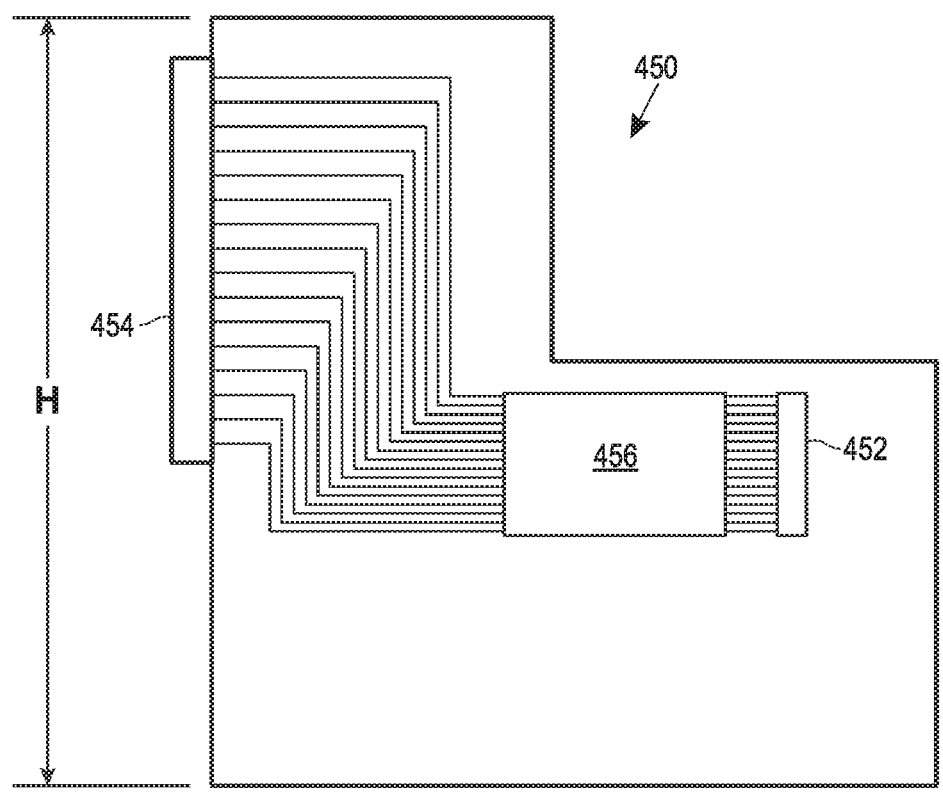
FIG. 13 illustrates a generic custom interface module according to this disclosure.

FIG. 13 illustrates a generic custom interface module 450, having an I/O card connector 452, a legacy wiring connector 454, and a signal conditioning module 456. The I/O card connector 452 is electrically connected to the signal conditioning module 456, which, in turn is electrically connected to the legacy wiring connector 454. Though not depicted in FIG. 13, the custom interface module 450 may also include current limiting circuitry and/or protective fuse(s). As should by now be understood, the legacy I/O card type dictates the type of legacy wiring connector 454, the position along a dimension, "H", of the legacy wiring connector 454 in the mounting rack, the number of channels, the card type (input or output), and the type of electrical signals, there may be a one-to-one correspondence between the legacy I/O card types and the custom interface modules, while all of the remaining components in the retrofit mounting system (the controller or carrier extender, the I/O cards, the I/O carrier, and the I/O terminal blocks) may remain the same (varying only in the number and size of I/O carries and the number of I/O cards). Moreover, inasmuch as some legacy I/O cards may differ only in the types (AC, DC, various voltages, etc.) and/or directions (input or output) of signals they carry, the custom interface modules corresponding to those legacy I/O cards need only differ by the signal conditioning module 456. Therefore, in embodiments, the signal conditioning module 456 may be removable and replaceable on the custom interface module 450 to minimize the number of custom interface module types that must be manufactured (a different one does not have to be manufactured for each signal type). Of course, the signal conditioning module 456 may, alternatively, be a module or even a set of discrete components permanently placed on the custom interface module 450.

Because the I/O card used in the retrofit mounting rack is always the same, in embodiments, the I/O card side of the signal conditioning module 456 (i.e., the side coupled to the connector 452) is always the same type of signal. For instance, the discrete I/O card may be configured to receive and transmit 24 VDC signals and, accordingly, the signal condition module 456 will always output 24 VDC signals to the connector 452 for input-type custom interface modules, and will always receive 24 VDC signals from the connector 452 for output-type custom interface modules. As a result, there need only be a limited number of variations on the signal conditioning module 456. In fact, there will be an input-type signal conditioning module 456 and an output-type signal conditioning module 456 for each signal type that would be present at the connector 454. Typical discrete signals include: 120 VDC, 120 VAC, 24 VAC, 48 VAC, 60 VAC, 27 VAC, 48 VDC, 220-240 VDC, and 220-240 VAC and relay contact, while typical analog signals include: RTD, Thermocouple 0-10 VDC, 0-5 VDC, 1-5 VDC, −10 to 10

VDC, 4-20 mA and 4-20 mA HART. Each discrete signal and most analog signals would require two variations—input and output—of the signal conditioning module. Additionally, 24 VDC signals and some analog signals may not require any signal conditioning, and thus could be accommodated by a pass-through type signal conditioning module.

Preferably, in embodiments, the custom interface module 450 is designed to facilitate airflow necessary to cool the I/O cards positioned above the custom interface module in the mounting rack. Specifically, the custom interface module 450 may be designed to promote (e.g., by convection) airflow from the bottom of the custom interface module 450 to the top of the custom interface module 450 and through the I/O card positioned above the custom interface module.

Figure 14:
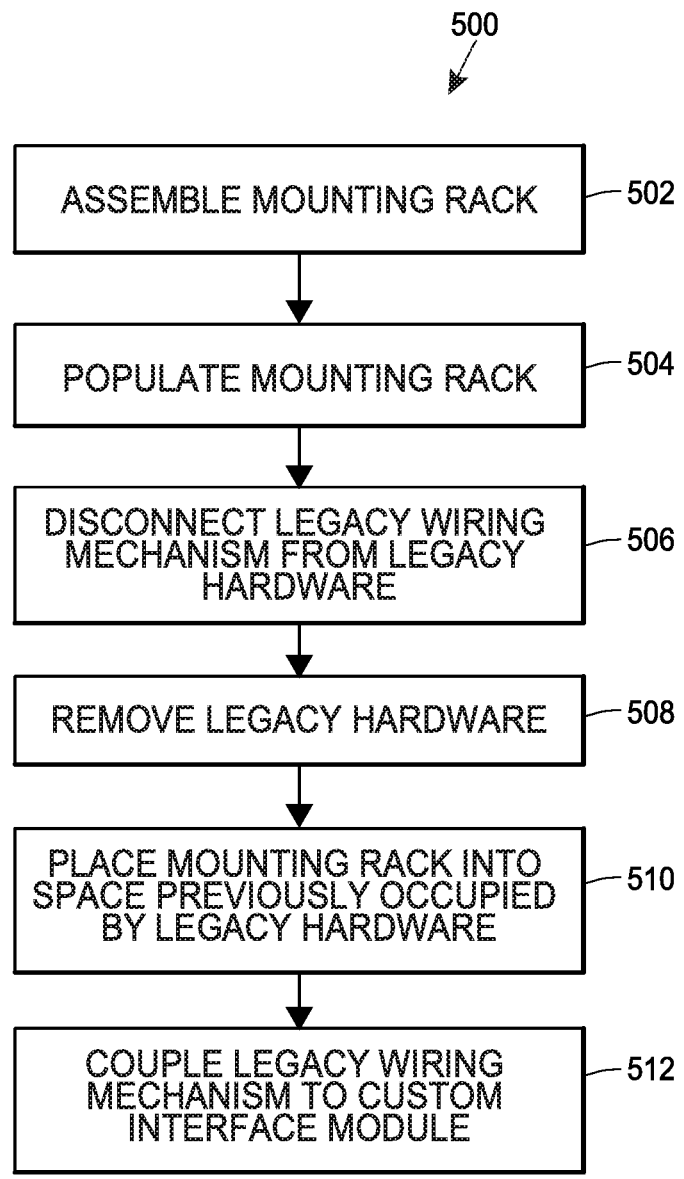
FIG. 14 depicts a method of upgrading a portion of a process control system according to the present disclosure.

A method 500 of upgrading a portion of a process control system from a legacy PLC-based system to a non-PLC process controller-based system will now be described with respect to FIG. 14. The method 500 includes assembling a mounting rack (block 502). In embodiments, assembling the mounting rack may require receiving information about the legacy PLC-based system including, by way of example and not limitation, the type of PLC-based system, the manufacturer of the PLC-based system, the number of I/O cards, the type of connectors employed between the legacy wiring and the I/O cards, and the types of signals communicated to or from each of the I/O cards.

Once the mounting rack is assembled, the mounting rack is populated with replacement hardware (block 504). The replacement hardware may include a non-PLC process controller or a carrier extender configured to be communicatively coupled to the non-PLC process controller. The replacement hardware may also include an I/O card coupled to the non-PLC process controller or to the carrier extender, an I/O terminal block, and a custom interface module.

Once the mounting rack is assembled and populated, the legacy wiring mechanism(s) (e.g., the swing-arm(s)) is/are disconnected from the legacy hardware (e.g., from the legacy I/O cards) associated with the PLC (block 506). The legacy wiring mechanism(s) may be pivoted away from the legacy I/O cards (in the case of swing-arms) or, in some cases, may be removed from the swing-arm rod about which they pivot, to provide greater accessibility to the legacy hardware and to facilitate easier removal thereof. With the legacy wiring mechanism (and the attached legacy wiring) out of the way—but without removing the legacy wiring from the legacy wiring mechanism—the legacy hardware associated with the PLC is removed (block 508). The removed hardware includes the legacy I/O cards and may include the rack in which they are mounted and, in embodiments, the power supply and/or communication hardware that communicates signals from the I/O cards to the PLC.

The assembled retrofit mounting rack is placed in the space previously occupied by the removed hardware (block 510). Thereafter, the legacy wiring mechanism is physically and electrically coupled to the replacement hardware (block 512) and, namely, to the custom interface module.

The following list of aspects reflects a variety of the embodiments explicitly contemplated by the present application. Those of ordinary skill in the art will readily appreciate that the aspects below are neither limiting of the embodiments disclosed herein, nor exhaustive of all of the embodiments conceivable from the disclosure above, but are instead meant to be exemplary in nature.

1. A method for upgrading a process control system from a legacy programmable logic controller (PLC) to a non-PLC process controller, the method comprising: assembling a mounting rack, the mounting rack sized and configured to fit into a space occupied by a rack containing legacy hardware associated with the legacy PLC; populating the mounting rack replacement hardware, the replacement hardware comprising: the non-PLC process controller or a carrier extender configured to be communicatively coupled to the non-PLC process controller; an input/output (I/O) card communicatively coupled to the non-PLC process controller or the carrier extender in the mounting rack; an I/O terminal block communicatively coupled to the I/O card and configured to communicate to the I/O card signals corresponding to a plurality of process control field devices and/or to communicate from the I/O card signals to a plurality of process control field devices; and a custom interface module communicatively coupled to (i) the I/O card via the I/O terminal block and (ii) the plurality of process control field devices via a legacy wiring mechanism coupled to legacy wiring of the process control system, without requiring modification or re-termination of the legacy wiring; disconnecting the legacy wiring mechanism from the legacy hardware associated with the PLC; removing the rack containing the legacy hardware associated with the legacy PLC; placing the assembled mounting rack, including the replacement hardware, into a space previously occupied by the rack containing the legacy hardware associated with the legacy PLC; and coupling the legacy wiring mechanism to the custom interface module.

2. The method according to aspect 1, wherein the replacement hardware comprises the non-PLC process controller.

3. The method according to aspect 1, wherein the replacement hardware comprises the carrier extender configured to be communicatively coupled to the non-PLC process controller.

4. The method according to any one of aspects 1 to 3, wherein the replacement hardware comprises a plurality of custom interface modules for coupling to a corresponding plurality of legacy wiring mechanisms.

5. The method according to aspect 4, wherein the replacement hardware comprises an equal number of I/O cards and custom interface modules, each I/O card communicatively coupled to a one of the plurality of custom interface modules.

6. The method according to aspect 4, wherein the replacement hardware comprises half the number of I/O cards as custom interface modules, each I/O card communicatively coupled to a pair of the plurality of custom interface modules.

7. The method according to any one of aspects 1 to 6, wherein the custom interface module conditions the signals communicated between the process control devices and the I/O card to be compatible with the I/O card.

8. The method according to any one of aspects 1 to 7, wherein the legacy hardware associated with the legacy PLC includes a legacy I/O card.

9. The method according to any one of aspects 1 to 8, wherein the legacy wiring is terminated at a swing-arm.

10. The method according to any one of aspects 1 to 9, wherein the I/O terminal block is coupled to the custom interface module via a ribbon cable.

11. The method according to aspect 10, wherein the ribbon cable is a self-coiling ribbon cable.

12. The method according to any one of aspects 1 to 11, wherein, after upgrading the process control system to the non-PLC process controller, the I/O card is removable without decoupling the legacy wiring mechanism from the custom interface module.

13. The method according to any one of aspects 1 to 12, further comprising receiving one or more parameters specifying one or more aspects of the mounting rack and the custom interface module before assembling the mounting rack and before populating the mounting rack.

14. The method according to aspect 13, further comprising determining from the one or more parameters specifying the one or more aspects of the mounting rack and the custom interface module, one or more of: (i) a type, input or output, associated with the custom interface module, (ii) a voltage to be received from or transmitted on the legacy wiring, (iii) a contact type coupling the legacy wiring mechanism to the custom interface module, (iv) a width, height, and/or depth of the mounting rack, (v) a number of I/O cards and/or I/O terminal blocks to populate in the mounting rack, and/or (vi) a number of custom interface modules to populate in the mounting rack.

15. The method according to any one of aspects 1 to 14, wherein the custom interface module is a pass-through module.

16. The method according to any one of aspects 1 to 15, wherein the components used to upgrade a first legacy PLC type differ from the components used to upgrade a second legacy PLC type only by the mounting rack and the custom interface module.

17. The method according to any one of aspects 1 to 16, wherein populating the mounting rack with replacement hardware comprises populating the mounting rack with a plurality of custom interface modules and wherein each of the plurality of custom interface modules is positioned to be coupled to a corresponding legacy wiring mechanism.

18. A custom interface module comprising: a legacy wiring coupling mechanism configured to mechanically and electrically couple the custom interface module to a counterpart legacy wiring coupling mechanism, the counterpart legacy wiring coupling mechanism having terminated thereto legacy wiring for carrying a plurality of signals to or from a plurality of process control field devices; an I/O coupling mechanism configured to facilitate electrical coupling of the custom interface module to an I/O card such that for each of the plurality of signals, a corresponding signal is communicated to or from the I/O card via the I/O coupling mechanism; a conditioning module electrically disposed between the I/O coupling mechanism and the legacy wiring coupling mechanism, wherein the conditioning module is configured to, for each of the plurality of signals (i) convert a signal received at the legacy wiring coupling mechanism into a signal that can be transmitted to the I/O card via the I/O coupling mechanism, or (ii) to convert a signal received from the I/O card via the I/O coupling mechanism into a signal that can be transmitted to a corresponding process control field device via the legacy wiring coupling mechanism.

19. The custom interface module according to aspect 18, wherein the counterpart legacy wiring coupling mechanism is disposed on a swing-arm.

20. The custom interface module according to either aspect 18 or aspect 19, wherein the I/O coupling mechanism is configured to accept a ribbon cable connector.

21. The custom interface module according to any one of aspects 18 to 20, wherein the signals passing through the I/O coupling mechanism are 24 VDC signals.

22. The custom interface module according to any one of aspects 18 to 20, wherein the signals passing through the I/O coupling mechanism are 4-20 mA signals.

23. The custom interface module according to any one of aspects 18 to 20, wherein the signals passing through the legacy wiring coupling mechanism are 120 VDC, 60 VAC, 27 VAC, 48 VDC, 240 VAC, 240 VDC.

24. The custom interface module according to any one of aspects 18 to 23, further comprising current limiting circuitry.

25. The custom interface module according to any one of aspects 18 to 24, further comprising an arrangement of components configured to facilitate airflow between the custom interface module and the I/O card.

26. The custom interface module according to any one of aspects 18 to 25, wherein the legacy wiring coupling mechanism is a card-edge connector.

27. A system for upgrading a process control system from a legacy programmable logic controller (PLC) to a non-PLC process controller, the system comprising: a mounting rack sized and configured to fit into a space occupied by legacy hardware associated with the legacy PLC; a non-PLC process controller; an input/output (I/O) card coupled to the non-PLC process controller and mounted in the mounting rack; an I/O terminal block communicatively coupled to the I/O card and configured to pass to the I/O card signals corresponding to a plurality of process control field devices and/or to send from the I/O card signals to a plurality of process control field devices, the I/O terminal block mounted in the mounting rack; and a custom interface module mounted in the mounting rack and communicatively coupled to (i) the I/O card via the I/O terminal block and (ii) the plurality of process control field devices via a legacy wiring mechanism coupled to legacy wiring of the process control system, without requiring modification or re-termination of the legacy wiring.

28. The system according to aspect 27, wherein the non-PLC process controller is mounted in the mounting rack.

29. The system according to aspect 27, wherein a carrier extender is mounted in the mounting rack and communicatively coupled to the non-PLC process controller, the carrier extender communicatively coupled to the I/O card and facilitating communication between the I/O card and the non-PLC process controller.

30. The system according to any one of aspects 27 to 29, wherein a plurality of custom interface modules are mounted in the mounting rack, the plurality of custom interface modules for coupling to a corresponding plurality of legacy wiring mechanisms.

31. The system according to aspect 30, wherein a number of I/O cards, equal to the number of custom interface modules in the plurality of custom interface modules, are mounted in the mounting rack, each I/O card communicatively coupled to a one of the plurality of custom interface modules.

32. The system according to aspect 30, wherein a number of I/O cards, equal to half the number of custom interface modules in the plurality of custom interface modules, are mounted in the mounting rack, each I/O card communicatively coupled to a pair of the plurality of custom interface modules.

33. The system according to aspect 30, wherein the system comprises one I/O card for each custom interface module.

34. The system according to aspect 30, wherein the system comprises one I/O card for every two custom interface modules.

35. The system according to any one of aspects 27 to 34, wherein the I/O terminal block is configured to be coupled to two custom interface modules.

36. The system according to any one of aspects 27 to 35, wherein each custom interface module is coupled to an I/O terminal block via a ribbon cable.

37. The system according to any one of aspects 27 to 36, wherein the custom interface module conditions signals sent from the I/O card to be compatible with the field devices or signals received from the field devices to be compatible with the I/O card.

38. The system according to any one of aspects 27 to 37, wherein the legacy hardware associated with the legacy PLC includes a legacy I/O card.

39. The system according to any one of aspects 27 to 38, wherein the legacy wiring is terminated on a swing-arm.

40. The system according to any one of aspects 27 to 39, wherein the I/O terminal block is communicatively coupled to the custom interface module via a ribbon cable.

41. The system according to aspect 40, wherein the ribbon cable is a self-coiling ribbon cable.

42. The system according to any one of aspects 27 to 41, wherein the I/O card is removable from the mounting rack without decoupling the legacy wiring mechanism from the custom interface module.

43. The system according to any one of aspects 27 to 42, wherein the custom interface module is a pass-through module.

44. The system according to any one of aspects 27 to 43, wherein the components used to upgrade from a first legacy PLC type differ from the components used to upgrade from a second legacy PLC type only by the mounting rack and the custom interface module.

45. The system according to any one of aspects 27 to 44, comprising a plurality of custom interface modules each positioned in the mounting rack such that a legacy wiring coupling mechanism of the custom interface module is aligned with a counterpart legacy wiring coupling mechanism coupled to the legacy wiring.

What is claimed:

1. A method for upgrading a process control system from a legacy programmable logic controller (PLC) to a non-PLC process controller, the method comprising:
    assembling a mounting rack, the mounting rack sized and configured to fit into a space occupied by a rack containing legacy hardware associated with the legacy PLC;
    populating the mounting rack replacement hardware, the replacement hardware comprising:
        the non-PLC process controller or a carrier extender configured to be communicatively coupled to the non-PLC process controller;
        an input/output (I/O) card communicatively coupled to the non-PLC process controller or the carrier extender in the mounting rack;
        an I/O terminal block communicatively coupled to the I/O card and configured to communicate to the I/O card signals corresponding to a plurality of process control field devices and/or to communicate from the I/O card signals to a plurality of process control field devices; and
        a custom interface module communicatively coupled to (i) the I/O card via the I/O terminal block and (ii) the plurality of process control field devices via a legacy wiring mechanism coupled to legacy wiring of the process control system, without requiring modification or re-termination of the legacy wiring;
    disconnecting the legacy wiring mechanism from the legacy hardware associated with the PLC;
    removing the rack containing the legacy hardware associated with the legacy PLC;
    placing the assembled mounting rack, including the replacement hardware, into a space previously occupied by the rack containing the legacy hardware associated with the legacy PLC; and
    coupling the legacy wiring mechanism to the custom interface module, wherein any one or more of the following is true:
        (a) the replacement hardware comprises the carrier extender configured to be communicatively coupled to the non-PLC process controller,
        (b) (i) the replacement hardware comprises a plurality of custom interface modules for coupling to a corresponding plurality of legacy wiring mechanisms and (ii) the replacement hardware comprises an equal number of I/O cards and custom interface modules, each I/O card communicatively coupled to a one of the plurality of custom interface modules,
        (c) (i) the replacement hardware comprises a plurality of custom interface modules for coupling to a corresponding plurality of legacy wiring mechanisms and (ii) the replacement hardware comprises half the number of I/O cards as custom interface modules, each I/O card communicatively coupled to a pair of the plurality of custom interface modules,
        (d) the I/O terminal block is coupled to the custom interface module via a ribbon cable,
        (e) the custom interface module is a pass-through module,
        (f) the components used to upgrade a first legacy PLC type differ from the components used to upgrade a second legacy PLC type only by the mounting rack and the custom interface module.

2. The method according to claim 1, wherein the replacement hardware comprises the non-PLC process controller.

3. The method according to claim 1, wherein at least (a) is true.

4. The method according to claim 1, wherein the replacement hardware comprises a plurality of custom interface modules for coupling to a corresponding plurality of legacy wiring mechanisms.

5. The method according to claim 1, wherein the custom interface module conditions the signals communicated between the process control devices and the I/O card to be compatible with the I/O card.

6. The method according to claim 1, wherein the legacy hardware associated with the legacy PLC includes a legacy I/O card.

7. The method according to claim 1, wherein the legacy wiring is terminated at a swing-arm.

8. The method according to claim 1, wherein, after upgrading the process control system to the non-PLC process controller, the I/O card is removable without decoupling the legacy wiring mechanism from the custom interface module.

9. The method according to claim 1, wherein populating the mounting rack with replacement hardware comprises populating the mounting rack with a plurality of custom interface modules and wherein each of the plurality of custom interface modules is positioned to be coupled to a corresponding legacy wiring mechanism.

10. The method according to claim 1, wherein at least (b) is true.

11. The method according to claim 1, wherein at least (c) is true.

12. The method according to claim 1, wherein at least (d) is true.

13. The method according to claim 12, wherein the ribbon cable is a self-coiling ribbon cable.

14. The method according to claim 1, further comprising receiving one or more parameters specifying a configuration of the mounting rack and the custom interface module before assembling the mounting rack and before populating the mounting rack.

15. The method according to claim 14, further comprising determining from the one or more parameters, one or more of: (i) a type, input or output, associated with the custom interface module, (ii) a voltage to be received from or transmitted on the legacy wiring, (iii) a contact type coupling the legacy wiring mechanism to the custom interface module, (iv) a width, height, and/or depth of the mounting rack, (v) a number of I/O cards and/or I/O terminal blocks to populate in the mounting rack, and/or (vi) a number of custom interface modules to populate in the mounting rack.

16. The method according to claim 1, wherein at least (e) is true.

17. The method according to claim 1, wherein at least (f) is true.

* * * * *